United States Patent
Ohkawa

(10) Patent No.: US 8,610,177 B2
(45) Date of Patent: Dec. 17, 2013

(54) CMOS IMAGING DEVICE HAVING U-SHAPED DEVICE ISOLATION REGIONS

(75) Inventor: Narumi Ohkawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 97 days.

(21) Appl. No.: 11/653,442

(22) Filed: Jan. 16, 2007

(65) Prior Publication Data

US 2007/0158713 A1    Jul. 12, 2007

Related U.S. Application Data

(63) Continuation of application No. PCT/JP2004/010288, filed on Jul. 20, 2004.

(51) Int. Cl.
*H01L 27/118* (2006.01)

(52) U.S. Cl.
USPC .............. 257/204; 257/E27.133; 438/478

(58) Field of Classification Search
USPC ................. 257/204, E27.133; 438/478
See application file for complete search history.

(56) References Cited

U.S. PATENT DOCUMENTS

| | | | |
|---|---|---|---|
| 6,107,655 A * | 8/2000 | Guidash | 257/233 |
| 6,160,281 A | 12/2000 | Guidash | |
| 6,593,607 B1 * | 7/2003 | Hseih | 257/292 |
| 6,633,334 B1 | 10/2003 | Sakurai et al. | |
| 7,542,085 B2 * | 6/2009 | Altice et al. | 348/296 |
| 2004/0005729 A1 | 1/2004 | Abe et al. | |
| 2004/0113151 A1 * | 6/2004 | Sekine | 257/72 |
| 2005/0274874 A1 * | 12/2005 | Nozaki et al. | 250/208.1 |

FOREIGN PATENT DOCUMENTS

| | | |
|---|---|---|
| CN | 1224971 A | 4/1999 |
| CN | 1497733 A | 5/2004 |
| EP | 1017106 A2 | 7/2000 |
| EP | 1 416 538 A2 | 5/2004 |
| EP | 1 416 538 A3 | 5/2004 |
| JP | 10-150182 A | 6/1998 |
| JP | 10-256521 A | 9/1998 |
| JP | 11-126895 A | 5/1999 |
| JP | 11-195776 A | 7/1999 |
| JP | 2000-152086 A | 5/2000 |
| JP | 2000-232216 A | 8/2000 |
| JP | 2000-260971 A | 9/2000 |
| JP | 2001-111022 A | 4/2001 |

(Continued)

OTHER PUBLICATIONS

Chinese Office Action dated Oct. 10, 2008, issued in corresponding Chinese Patent Application No. 2004800436335.

(Continued)

*Primary Examiner* — Thao Le
*Assistant Examiner* — Matthew Gordon
(74) *Attorney, Agent, or Firm* — Westerman, Hattori, Daniels & Adrian, LLP

(57) ABSTRACT

A CMOS imaging device formed of plural CMOS photosensors arranged in a row and column formation, wherein a first CMOS photosensor and a second CMOS photosensor adjacent with each other in a column direction are formed in a single, continuous device region defined on a semiconductor substrate by a device isolation region.

12 Claims, 31 Drawing Sheets

(56) References Cited

FOREIGN PATENT DOCUMENTS

| | | | |
|---|---|---|---|
| JP | 2001-298177 A | | 10/2001 |
| JP | 2002-57315 A | | 2/2002 |
| JP | 2003-188367 A | | 7/2003 |
| JP | 2003-273343 A | | 9/2003 |
| JP | 2004-95966 A | | 3/2004 |
| JP | 2004095966 A | * | 3/2004 |
| JP | 2004-153253 A | | 5/2004 |
| KR | 2004-0033366 | | 4/2004 |

OTHER PUBLICATIONS

International Search Report of PCT/JP2004/010288, date of mailing Sep. 28, 2004.
Korean Office Action dated Jan. 25, 2008 (mailing date), issued in corresponding Korean Patent Application No. 2007-7001293.
European Search Report dated Jul. 16, 2007, issued in corresponding European Patent Application No. 04 74 7752.
European Search Report dated Jan. 15, 2009, issued in corresponding European Patent Application No. 08158577.0.

* cited by examiner

CMOS IMAGING DEVICE HAVING U-SHAPED DEVICE ISOLATION REGIONS

CROSS-REFERENCE TO RELATED APPLICATION

The present invention is a continuation application filed under 35 U.S.C. 111(a) claiming benefit under 35 U.S.C. 120 and 365(c) of PCT application JP2004/010288 filed on Jul. 20, 2004, the entire contents of which are incorporated herein as reference.

BACKGROUND OF THE INVENTION

The present invention generally relates to semiconductor devices and more particularly to a CMOS imaging device.

Today, CMOS imaging devices are used widely in portable telephone handsets equipped with camera or digital still cameras. A CMOS imaging device has a simple construction as compared with CCD imaging devices and has an advantageous feature of being constructed with low cost.

FIG. 1 shows the construction of such a CMOS imaging device 100.

Referring to FIG. 1, the CMOS imaging device 100 has a light receiving region 101A in which a large number of CMOS pixel elements 10 are arranged in a row and column formation, and a row selection circuit 101B and a signal reading circuit 101C cooperate with each CMOS pixel element 10 in the light receiving region 101A. Here, it should be noted that the row selection circuit 101B selects a transfer control line TG, a reset control line RST and further a selection control line SEL of a desired CMOS pixel element 10, while the signal reading circuit 101C supplies a reset voltage to a reset voltage line VR and reads out a signal voltage output from the pixel to signal a reading line SIG.

FIG. 2 shows the construction of a CMOS device 10 for one pixel used with the CMOS imaging device 100 of FIG. 1.

Referring to FIG. 2, a photodiode 10D is connected to a power supply terminal 10A, which in turn is connected to the reset voltage line VR for receiving a predetermined reset voltage, via a reset transistor 10B controlled by a reset signal on the reset control line RST and a transfer gate transistor 10C controlled by a transfer control signal on the transfer control line TG, in a manner that the photodiode 10D is provided with reverse biasing, and thus, the photoelectrons formed by optical irradiation in the photodiode 10D are accumulated in a floating diffusion region FD formed in an intermediate node between the reset transistor 10B and the transfer gate transistor 10C through the transfer gate transistor 10C and is converted to voltage therein.

Thus, with the construction of FIG. 2, the voltage signal formed in the floating diffusion region FD is read by the reading transistor 10F driven by the supply voltage from the power supply terminal 10A, wherein it should be noted that the reading transistor 10F forms a source follower circuit. The output of the reading transistor 10F is then provided to the signal line SIG by the select transistor 10S. The select transistor 10S is connected to the reading transistor in series and controlled by the selection control signal on the selection control line SEL.

Meanwhile, it is also possible to use a CMOS element 10' of the construction in which the reading transistor 10F and the selection transistor 10S are interchanged as shown in FIG. 3 for the CMOS pixel element operating identically to the CMOS pixel element 10 of FIG. 2.

FIG. 4 is a diagram explaining the operation of the CMOS pixel element 10 or 10' of FIG. 2 or FIG. 3.

Referring to FIG. 4, the selection control signal on the selection control line SEL goes up at first, and a column that includes the desired CMOS pixel element is selected by the conduction of the select transistor 10S.

Next, the reset signal on the reset control line RST goes up, and as a result of the conduction of the reset transistor 10B, the floating diffusion region FD is charged to a reset state. In this stage, it should be noted that the transfer transistor 10C is turned off. In response to the rising of the reset signal, there occurs rising of electric potential in the floating diffusion region FD, while the effect of this rising of the electric potential of the floating diffusion region FD appears also on signal line SIG via the reading transistor 10F and the select transistor 10S, which is in a conduction state. This rising of the signal line SIG, however, is not used for signal reading.

Next, after falling of the reset signal, the transfer gate transistor 10C maintains the turn-off state and the electric potential of the floating diffusion region FD is read out on the signal line SIG by the reading transistor 10F. With this, reading of noise level is achieved.

Further, after reading of the noise level, there occurs rising of the transfer control signal on the transfer control line TG, and the electric charges formed in the photodiode 10D are transferred to the floating diffusion region 10F through the transfer gate transistor 10C. Thereby, the electric potential of the floating diffusion region 10F is changed by $\Delta V = Q/C$ by the electric charges of the amount Q thus transferred, wherein C is the capacitance of the floating diffusion region FD. Thus, the electric potential of the floating diffusion region FD is read by transistor 10F after the transfer control signal has fallen down and is provided to the signal line SIG through the select transistor 10S.

SUMMARY OF THE INVENTION

Meanwhile, in the case of forming the imaging device 100 such as the one shown in FIG. 1 by integrating the CMOS pixel elements of FIG. 2 or FIG. 3, there is a proposal to simplify the construction of the pixel elements and to improve the integration density by using a construction such as the one shown in FIG. 5, in which several transistors are shared by plural CMOS pixel elements.

With the example of FIG. 5, the reset transistor 10B, the reading transistor 10F and the select transistor 10S are shared by two CMOS pixel elements CMOS1 and CMOS2 that are neighboring in the column direction.

Further, there are proposals of sharing the constituent elements of the CMOS pixel element between two or more lines or two or more columns.

FIG. 6 shows an exemplary layout $10_1$ for realizing the circuit construction of FIG. 5 (see Japanese Laid-Open Patent Application 2000-232216 Official Gazette).

Referring to FIG. 6, the CMOS pixel elements PX1 and PX2 are formed adjacent to each other in the respective device regions defined in the silicon substrate by a device isolation region 10I in the column direction (vertical direction in the drawing) with this conventional layout, wherein the floating diffusion region FD1 of the element PX1 and the floating diffusion region FD2 of the element PX2 are connected by an interconnection pattern 10f that extends over the silicon substrate surface. With the construction of FIG. 6, the diffusion region that forms the photodiode 10D and the diffusion region that forms the floating diffusion region FD1 in the element PX1 form a continuous first device region 10W1, while in the element PX2, the diffusion region forming the photodiode 10D, the diffusion region forming the floating diffusion region FD2, and the diffusion region forming the transistors 10B, 20F and 10S form a second diffusion region 10W2, which is different from the first diffusion region 10W1.

However, with such a construction that has the first and second device regions 10W1 and 10W2 separated by the device isolation structure 10I, there is a need of forming contact holes at two locations in correspondence to the floating diffusion regions FD1 and FD2 on the silicon substrate for connecting the interconnection pattern 10f, while there arises a problem with such a construction that the electric charges accumulated in the floating diffusion region FD1 or FD2 may cause dissipation to the substrate because of junction leakage, which takes place via the defects formed at the time of formation of the contact holes. Further, because of increased number of contact holes, there arises a problem that the production yield tends to be decreased. Further, with such a construction, there is a need of forming the floating diffusion regions FD1 and FD2 to have unnecessarily large size because of the need of forming the contact holes, while formation of the floating diffusion regions FD1 and FD2 with such large area impedes the improvement of integration density.

FIG. 7 shows a different layout $10_2$ described in Japanese Laid-Open Patent Application 11-126895 Official Gazette, wherein those parts corresponding to the parts explained previously, are designated by the same reference numerals and the description thereof will be omitted.

Referring to FIG. 7, this conventional layout uses the reset transistor 10B, the reading transistor 10F and the selection transistor 10S commonly between the four CMOS pixel elements PX1-PX4 that are provided adjacent with each other in a row direction (lateral direction in the drawing) and also in a column direction (vertical direction in the drawing).

More specifically, there are defined pixel regions of the CMOS pixel elements PX1-PX4 on the silicon substrate by the device isolation region 10I, and there is formed a common floating diffusion region FD1 between the elements PX1 and PX2 via respective transfer gate transistors 10C. Similarly, there is formed a common floating diffusion region FD2 between the CMOS pixel elements PX3 and PX4 through the respective transfer gate transistors 10C.

Further, the floating diffusion regions FD1 and FD2 are connected to the power supply terminal 10A, which is formed commonly to the CMOS pixel elements PX1-PX4 via the respective reset transistors 10B. Further, between the CMOS devices PX1 and PX3 and between the CMOS devices PX2 and PX4, it can be seen that the reading transistor 10F and the select transistor 10S are formed in continuation so as to be shared by the CMOS devices PX1-PX4. Thereby, the diffusion regions that form the photodiode 10D of the element PX1-PX4 form, together with the floating diffusion regions FD1 and FD2 and the diffusion region of the reset transistor 10B, a single, continuous first device region 10W11, while the diffusion regions that form the reading transistor 10F and the select transistor 10S form together a second device region 10W12 different from the first the device region 10W11 in a manner separated from the first the diffusion region by the device isolation structure 10I.

With such a construction, in which the floating diffusion region FD1 or FD2 and further the reset transistor 10B are shared between the two CMOS pixel elements and the reading transistor 10F and the select transistor 10S are shared among the four CMOS pixel elements PX1-PX4, it becomes possible to improve the integration density further.

On the other hand, with the construction of FIG. 7, there exist two floating diffusion regions FD1 and FD2, and interconnection between the floating diffusion region FD1 or FD2 and the reading transistor 10F is conducted by using the interconnection pattern not illustrated. Because of this, there is a need of forming contact holes on the silicon substrate respectively in the floating diffusion regions FD1 and also FD2, while formation of such contact holes in the floating diffusion regions increases the risk of dissipation of electric charges to the substrate by way of junction leakage current as explained before. Further, because the reset transistor 10B and the reading transistor 10F are formed at different locations, there is a need of forming the power supply terminal 10A at two locations, while this raises a problem of production yield.

FIG. 8 shows a different layout $10_3$ disclosed in Japanese Laid-Open Patent Application 10-150182 Official Gazette, wherein those parts corresponding to the parts explained previously are designated by the same reference numerals.

Referring to FIG. 8, in this conventional layout, the CMOS pixel elements PX1 and PX2 are formed adjacent with each other in the column direction (vertical direction in the drawing), and the floating diffusion region FD is formed commonly between photodiode 10D of the CMOS pixel element PX1 and the photodiode 10D of the CMOS pixel element PX2 via the respective transfer gate transistors 10C. Thereby, the photodiode 10D of the element PX1 and the photodiode 10D of the element PX2 form the first device region 10W21 together with the floating diffusion region FD in between.

The floating diffusion FD is connected the reset transistor 10B via an interconnection pattern 10f that extends over the silicon substrate surface, the reset transistor 10B being connected to the power supply terminal 10A, wherein the floating diffusion region FD is further connected to the reading transistor 10F of source follower construction through the interconnection pattern 10f. It should be noted that the reading transistor 10F is connected to a different power supply terminal 10A. On the other hand, the select transistor 10S is formed on the side of the source of the transistor 10F, wherein the select transistor 10S is connected to the signal line SIG via a contact hole. Thereby, it should be noted that the reset transistor 10B, the reading transistor 10F and the select transistor 10S are formed in a second device region 10W22 different from the first the device region 10W21.

With the construction of FIG. 8, the gate electrodes of the reset transistor 10B and the selection transistor 10S are formed by a polysilicon pattern that continuously extends over the silicon substrate surface, and because of this, there arises a problem in that restriction is imposed on the size of the diffusion region forming the photodiode 10D, and hence the size of the light receiving region of the CMOS pixel element. Further, because of the fact that the floating diffusion region FD is connected to the drain region of the reset transistor 10B by the interconnection pattern 10f, there is the possibility with such a construction that dissipation of electric charges to the substrate may take place by junction leakage not only at the contact holes in the floating diffusion region FD but also in the contact hole formed in the drain region of the reset transistor.

FIG. 9 shows a different layout $10_4$ described in Japanese Laid-Open Patent Application 2001-298177 Official Gazette. In the drawing, those parts corresponding to the parts explained previously are designated by the same reference numerals.

Referring to FIG. 9, there are formed CMOS pixel elements PX1 and PX2 adjacent with each other in alignment in the column direction, wherein respective photodiodes 10D, transfer gate transistors 10C and common floating diffusion regions FD of the CMOS pixel elements PX1 and PX2 are formed in a first device region W31, which in turn is formed in a device isolation structure. Further, while not illustrated, there is formed a reading circuit including the reset transistor 10B, reading transistor 10F and selection transistor 10S in a second device region W32 different from the first device region W31. Further, the floating diffusion region FD in the first the device region W31 and the reset transistor in the second device region W32 are connected by an interconnection pattern 10f having contact holes C1 and C2 to the substrate.

Even with such a construction, there are needed two contact holes on the substrate, and there is a concern that increase of junction leakage at the floating diffusion region FD may cause noise. Further, with such a structure, there is a need of increasing the junction area of the floating diffusion region FD for the purpose of forming contact hole C1, and there arises a problem also from viewpoint of improvement of integration density.

FIG. 10 shows a further different layout $10_5$ of Japanese Laid-Open Patent Application 2000-152086 Official Gazette.

Referring to FIG. 10, with this conventional layout, four, mutually adjacent CMOS pixel elements PX1-PX4 aligned in the row direction (lateral direction in the drawing) and in the column direction (vertical direction in the drawing) share the reset transistor 10B, the reading transistor 10F and the select transistor 10S commonly.

More specifically, the pixel regions of the CMOS pixel elements PX1-PX4 are defined on the silicon substrate by the device isolation region 10I, and the floating diffusion region FD is formed commonly between the elements PX1-PX4 via the respective transfer gate transistors 10C. Further, the reset transistor 10A having a contact hole corresponding to the power supply terminal 10A is provided to a part of the floating diffusion region FD. Further, the photodiode 10D, the transfer gate transistor 10C and the reset transistor 10B are formed in the first device region W1 commonly.

Further, with the conventional example of FIG. 10, a second device region W42 different from a first device region W41 is formed between the CMOS pixel elements such as the elements PX1 and PX2 adjacent in the vertical direction, and the reading transistor 10F and the select transistor 10S are formed in the device region W42.

With the construction of FIG. 10, it is true that there is formed only one contact hole, a contact hole C1, in the floating diffusion region FD in connection with the gate electrode of the foregoing reading transistor 10F, while there is a need of forming a contact hole 10 in the first device region W41 for the power supply terminal 10A of the reset transistor 10A, and there is further a need of forming a contact hole in the second device region W42 as the power supply terminal 10A of the reading transistor 10F. Thus, there is a concern with the construction of FIG. 10 that the production yield falls off, and there further arises a problem that the interval of the photodiodes 10D in the vertical direction is different from the interval in the lateral direction, and thus, it is not possible to dispose the light receiving elements uniformly over the light receiving surface.

Thus, with the conventional layout of FIG. 5 that realizes a circuit that shares the reading transistor 10F, there is a need of forming the plural active regions in the layout pattern corresponding to the foregoing circuit with separation by the device isolation region, while such a construction increases the device area and there has been a problem of attaining the desired integration density, and hence desired improvement of resolution. Further, in some of the layout patterns, there has been a need of forming plural contact holes in the floating diffusion region in which accumulation of the photoelectron, formed as a result of photoelectric conversion, takes place, while such a construction raises the problem that the photo- electrons easily escape to the substrate by causing junction leakage. Further, depending on the layout pattern, there are cases in which it is necessary to form plural power supply contact holes for supplying the supply voltage (reset voltage), while formation of the plural power supply contact holes cause decrease in the yield of the CMOS imaging device.

Patent Reference 1
Japanese Laid-Open Patent Application 2000-232216 Official Gazette
Patent Reference 2
Japanese Laid-Open Patent Application 2001-298177 Official Gazette
Patent Reference 3
Japanese Laid-Open Patent Application 11-126895 Official Gazette
Patent Reference 4
Japanese Laid-Open Patent Application 10-256521 Official Gazette
Patent Reference 5
Japanese Laid-Open Patent Application 2000-152086 Official Gazette
Patent Reference 6
Japanese Laid-Open Patent Application 2000-260971 Official Gazette
Patent Reference 7
Japanese Laid-Open Patent Application 10-150182 Official Gazette In one aspect, the present invention provides a CMOS imaging device formed of plural CMOS photosensors arranged in a row and column formation, wherein a first CMOS photosensor and a second CMOS photosensor adjacent with each other in a column direction are formed in a single, continuous device region defined on a semiconductor substrate by a device isolation region.

In another aspect, the present invention provides a CMOS imaging device formed of plural CMOS photosensors disposed in a row and column formation, wherein a first CMOS photosensor and a second CMOS photosensor adjacent with each other in a column direction, and a third CMOS photosensor adjacent to the first CMOS photosensor in the row direction and a fourth CMOS photosensor adjacent to the second CMOS photosensor in the row direction, are formed in a single, continuous device region defined on a semiconductor substrate by a device isolation region.

According to the present invention, it becomes possible to use a single power supply contact in a CMOS imaging device that integrates CMOS photosensors, by integrating plural CMOS photosensors in a single, continuous device region defined on a semiconductor substrate by a device isolation region. With this, it is possible to improve the production yield of the CMOS imaging device. Also, it is possible to form the floating diffusion region in the single device region so as to be shared commonly by the plural CMOS photosensors. Thereby, it becomes possible to use a single signal contact for taking out a signal voltage from such a floating diffusion region. As a result, it becomes possible to avoid fake signals caused by junction leakage and it becomes possible to obtain a highly efficient CMOS imaging device.

Other objects and further features of the present invention will become apparent from the following detailed description when read in conjunction with the attached drawings.

DETAILED DESCRIPTION OF PREFERRED EMBODIMENTS

First Embodiment

Figure 11:
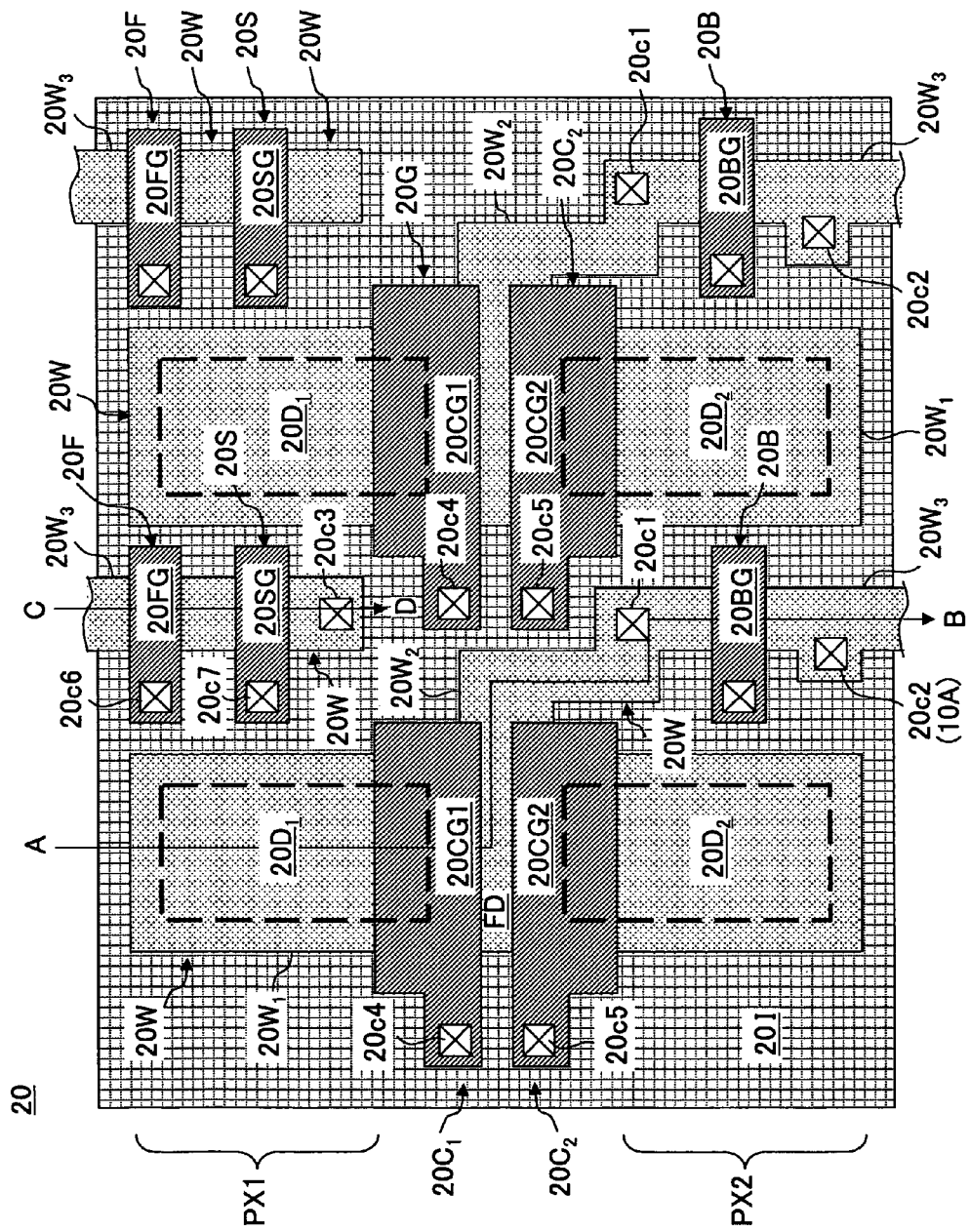
FIG. 11 is a diagram showing the layout of a CMOS imaging device according to a first embodiment of the present invention.

FIG. 11 shows the layout of a CMOS imaging device 20 according to a first embodiment of the present invention.

Figure 5:
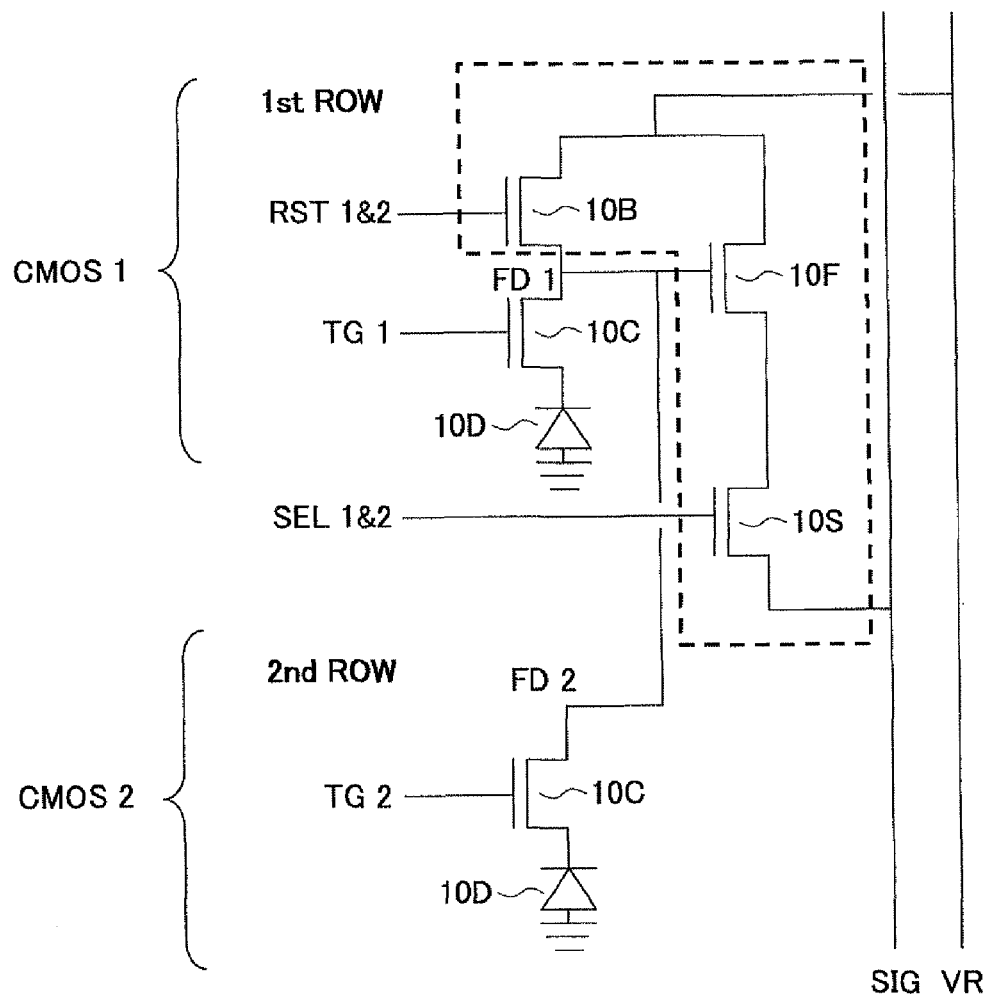
FIG. 5 is a diagram showing the circuit construction of a CMOS imaging device that integrates two CMOS photosensors of FIG. 2 and provided with common selection and reading circuits.
Figure 6:
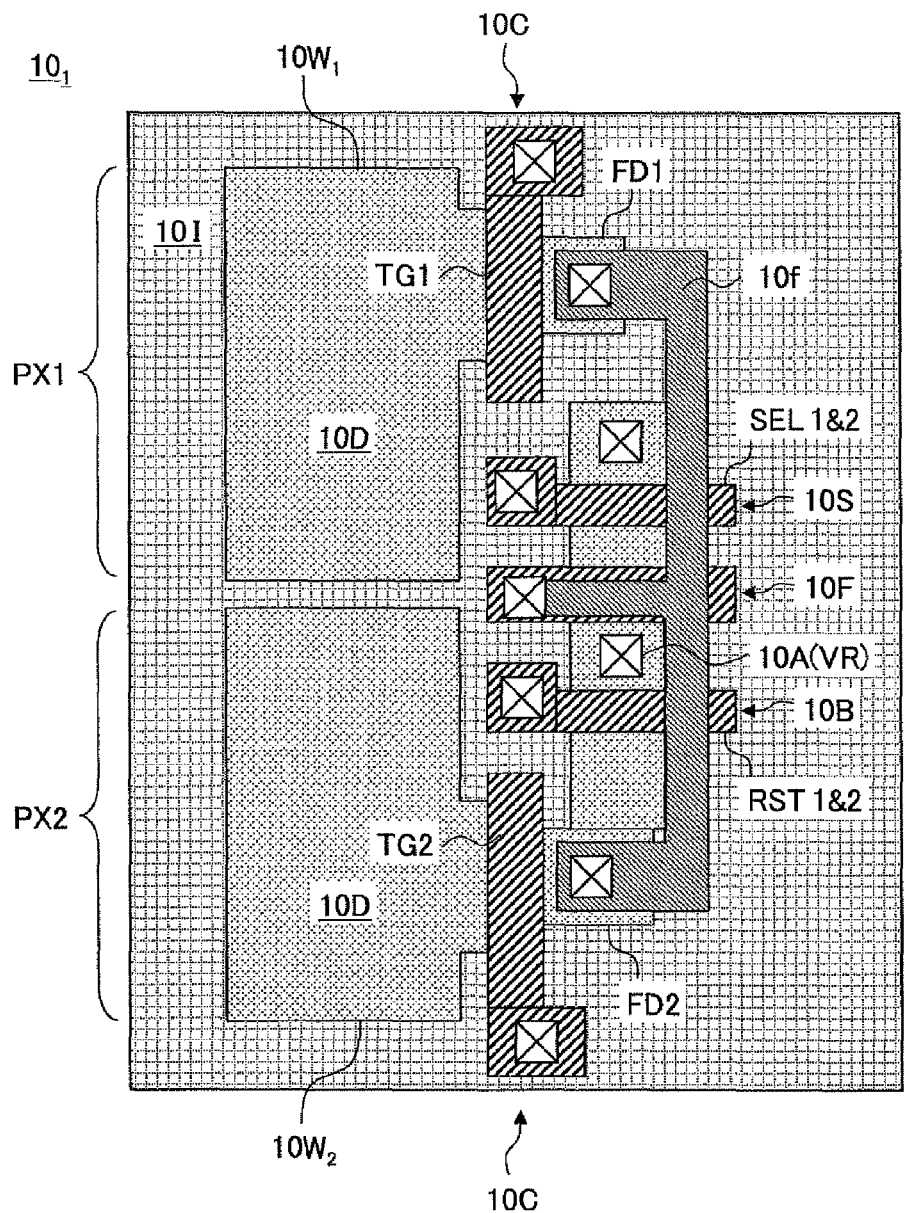
FIG. 6 is a diagram showing an example of a conventional layout that realizes the circuit construction of FIG. 5.

Referring to FIG. 11, the CMOS imaging device 20 has the same equivalent circuit diagram as the case of the device of FIG. 5 and has the feature that a single device region 20W defined by a device isolation region 20I is formed on a silicon substrate surface.

More specifically, a device region part 20W1 is defined on the surface of the silicon substrate by the device isolation region 20I such that the device region part 20W1 extends in a column direction (vertical direction in the drawing) to form a part of the single device region 20W, wherein a pixel PX1 corresponding to a CMOS photosensor CMOS1 and a pixel PX2 corresponding to a CMOS photosensor CMOS2 of FIG. 5 are formed in the device region part 20W1 in a manner adjacent with each other in the column direction.

Thus, in the device region part 20W1, there are formed a diffusion region 20D1 and a diffusion region 20D2 in alignment in the column direction, and the diffusion region 20D1 forms the photodiode 10D of the CMOS photosensor CMOS1 in the pixel PX1 while the diffusion region 20D2 forms the photodiode 10D of the CMOS photosensor CMOS2 in the pixel PX2. Thereby, it should be noted that a floating diffusion region FD1 of the pixel PX1 and a floating diffusion region FX2 of the pixel PX2 are formed in the device region 20W1 as a common floating diffusion region FD between the diffusion region 20D1 and the diffusion region 20D2.

Further, between the diffusion region 20D1 and the common floating diffusion region FD, there is formed a transfer gate transistor 20C1 for the pixel PX1 such that the transfer control signal TG is supplied to the gate electrode thereof, while a transfer gate transistor 20C2 for the pixel PX2 is formed between the diffusion region 20D1 and the common floating diffusion region FD such that the transfer control signal TG is supplied to the gate electrode thereof. The transfer gate transistor 20C1 is formed in correspondence to the transfer gate transistor 10C of the CMOS photosensor CMOS1 and the transfer gate transistor 20C2 is formed in correspondence to the transfer gate transistor 10C of the CMOS photosensor CMOS2. In response to the transfer control signal TG supplied to the gate electrode 20CG1 of the transfer gate transistor 20C1 or to the gate electrode 20CG2 of the transfer gate transistor 20C2, the photoelectrons formed in the photodiode diffusion region 20D1 of the pixel PX1 or the photodiode diffusion region 20D2 of the pixel PX2 are transferred to the common floating diffusion region FD.

Further, in the part where the common floating diffusion region FD is formed, there extends a device region part 20W2 from the device region part 20W1 in a row direction, wherein the device region part 20W2 is connected to a device region part 20W3, which constitutes a part of the single device region 20W. The device region part 20W3 extends in the column direction. Thereby, the device region part 20W2 and the part of the device region part 20W3 to which the device region part 20W2 is connected form the common floating diffusion region FD.

Further, a single contact 20c1 is formed to the part of the device region part 20W3 that constitutes the common floating diffusion region FD, and there is further formed a single contact 20c2 corresponding to the power supply terminal 10A with offset from the single contact 20c1 in the column direction. Further, in the device region part 20W3, a common reset transistor 20B is formed between the contacts 20c1 and 20c2. The common reset transistor 20B is supplied with the reset control signals RST1 and RST2 at a gate electrode 20BG thereof and resets the common floating diffusion region FD. Thus, the reset transistor 20B is shared by the pixel PX1 and the pixel PX2.

It should be noted that the third device region part 20W3 extends in the column direction to the next pixel region adjacent to the pixel element PX2 in the column direction beyond the contact 20c2 (see FIG. 12), and there are formed, in the extension part of the device region part 20W3, a reading transistor 20F corresponding to the reading transistor 10F of FIG. 5 and having the gate electrode 20FG and a select transistor 20S corresponding to the select transistor 10S, wherein the select transistor 20S is supplied with the selection control signals SEL1 and SEL2 at the gate electrode 20SG.

Further, at the tip end of the extension part of the device region part 20W3, and hence at the location beyond the select transistor 20S, there is formed a contact 20c3 to which the signal line SIG is connected.

Figure 12:
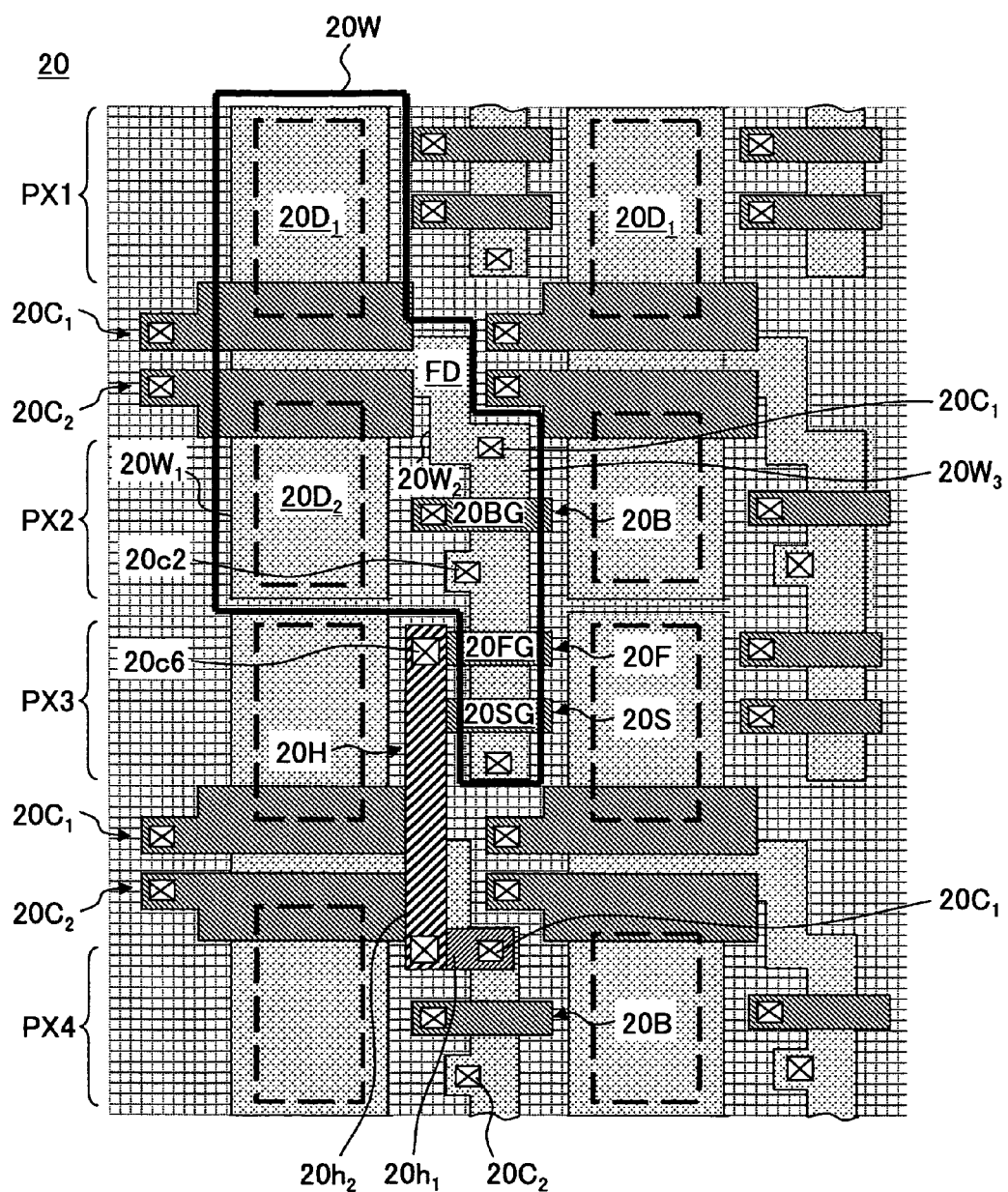
FIG. 12 is a diagram showing the layout of FIG. 11 over wider area.

FIG. 12 is a plan view that shows a wider area of the CMOS imaging device 20 of FIG. 11.

Referring to FIG. 12, it can be seen that, adjacent to the pixels PX1 and PX2, there are formed different pixels PX3 and PX4 of the same construction in repetition in the column direction, wherein the common floating diffusion region FD of the pixels PX3 and PX4 are connected to the gate electrode 20FG of the common reading transistor 20F of the pixels PX1 and PX2 by an interconnection pattern 20H that extends over the semiconductor substrate. The common reading transistor 20F then reads out the voltage signal, which is formed by the photoelectrons formed in the photodiodes of the pixels PX3 and PX4 and are transferred to the common floating diffusion region FD, by using a source follower circuit. Similarly, the voltage signal formed in the pixels PX1 and PX2 is read out by a common reading transistor of another pixel element of the same construction but not illustrated and formed adjacent to the pixel PX1 in the upper columnar direction in the representation of FIG. 12. Meanwhile, in FIG. 12, it should be noted that the interconnection pattern 20H is formed of a first layer metal interconnection pattern 20h1 extending out from the contact 20c1 formed in the common floating diffusion region FD, a second layer metal interconnection pattern 20h2 contacting to the first layer metal interconnection pattern 20h1 and extending in the column direction, and a first layer interconnection pattern 20h3 that connects the second layer metal interconnection pattern 20h2 to the gate electrode 20FG of the reading transistor 20F (see FIG. 13).

As will be understood from FIG. 12, the pixel elements PX1 and PX2 are formed in a single device region 20W shown in FIG. 12 with thick line.

Thus, with the present embodiment, one contact is sufficient for the contact hole formed to the common floating diffusion region FD, and with this, the problem of noise electric charges flowing into the common floating diffusion region FD in the form of junction leakage via the defects associated with the contact hole formed to the semiconductor substrate, is reduced.

Further, only one power supply contact is sufficient for the device region 20W, and the problem of decrease of yield brought about conventionally as a result of formation of large number of power supply contacts is reduced.

Further, with the layout of FIG. 11, the contacts 20c4 and 20c5 of the gate electrodes 20CG1 and 20CG2 of the transfer gate transistors 20C1 and 20C2 are formed on the device isolation structure 20I in the part corresponding to the gap of the diffusion region parts 20W3 formed adjacent to the device region part 20W1 so as to extend in the column direction, and with this, it becomes possible with the CMOS imaging device 20 to reduce the interval between the adjacent pixel elements aligned in the row direction.

Figure 13:
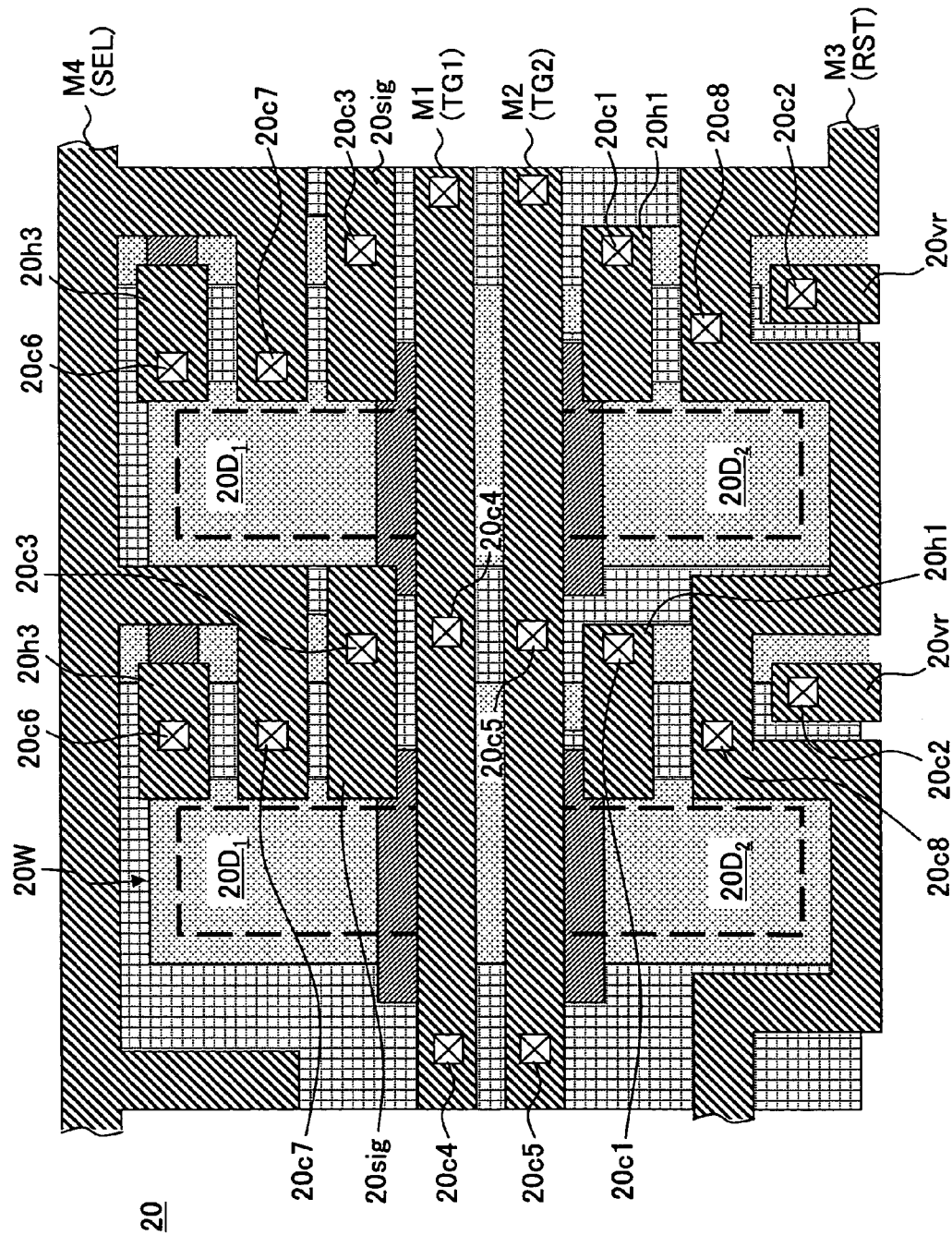
FIG. 13 is a diagram showing a first layer interconnection pattern used with the layout of FIG. 11.

FIG. 13 shows a first layer interconnection pattern formed on the structure of FIG. 11.

Figure 1:
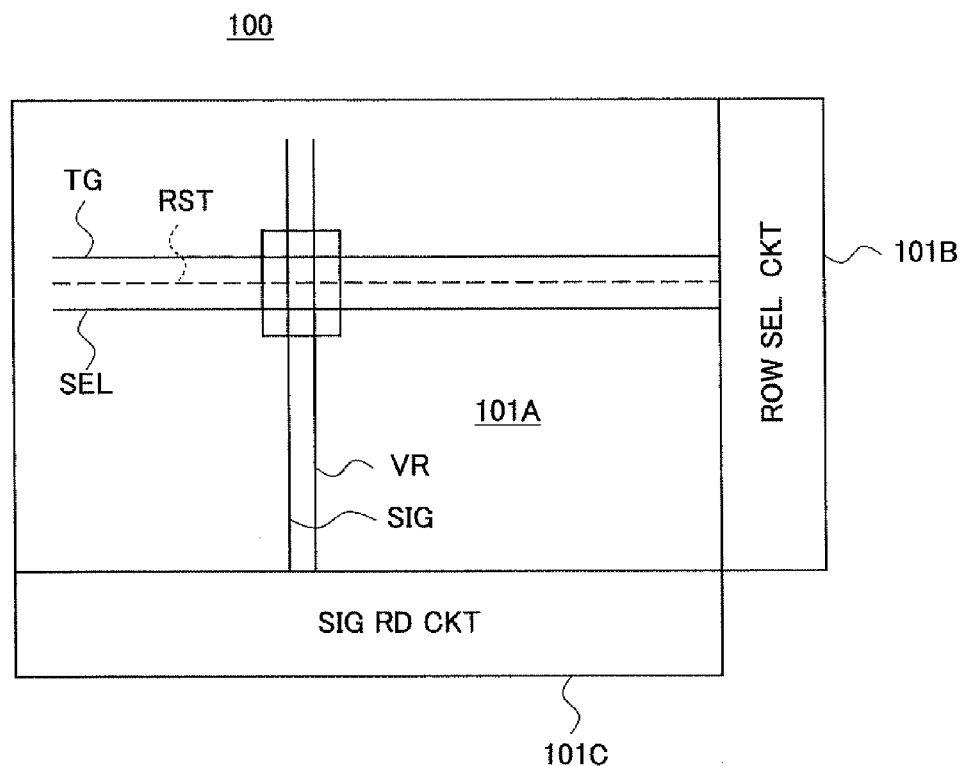
FIG. 1 is a diagram schematically showing the construction of a CMOS imaging device.
Figure 2:
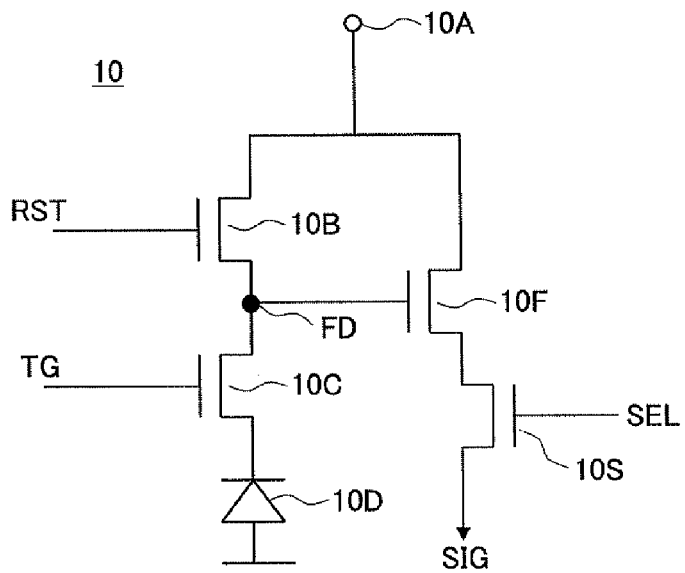
FIG. 2 is a diagram showing a circuit construction of a CMOS photosensor used in the CMOS imaging device of FIG. 1.
Figure 3:
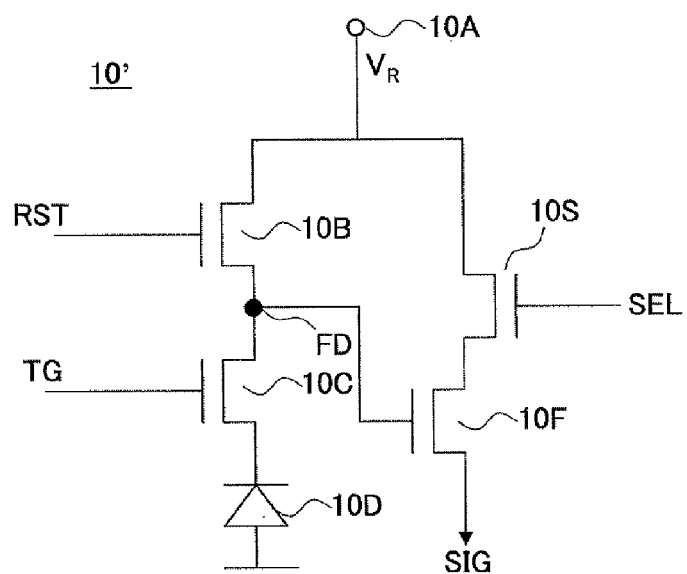
FIG. 3 is a diagram showing the circuit construction according to a modification of FIG. 2.
Figure 4:
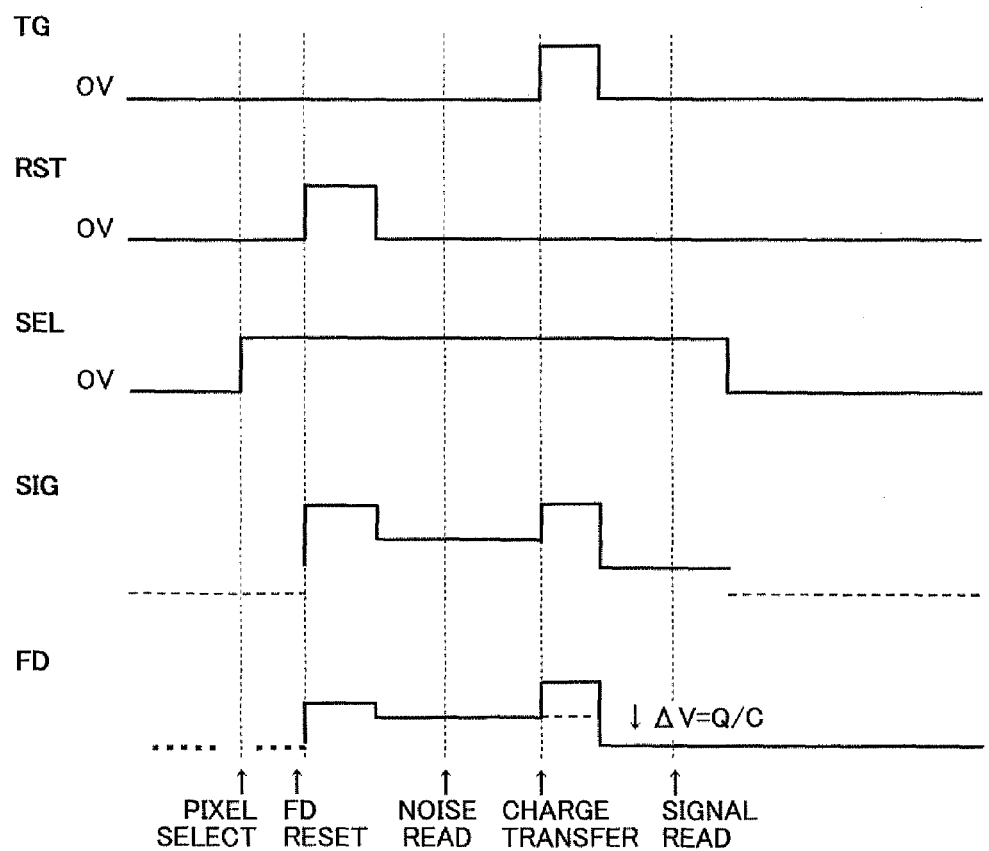
FIG. 4 is a timing chart explaining an operation of the CMOS photosensor of FIG. 2 or FIG. 3.

Referring to FIG. 13, there extend metal interconnection patterns M1 and M2 constituting the transfer control line TG of FIG. 1 on the semiconductor substrate in the row direction continuously, wherein the interconnection patterns M1 and M2 are connected to the gate electrodes 20CG1 and 20CG2 of the transfer control transistors 20C1 and 20C2 in the respective columns via respective contacts 20c4 and 20c5.

Further, with FIG. 13, there extends a metal interconnection pattern M3 constituting the reset control line RST of FIG. 1 zigzag in the row direction by avoiding the diffusion regions 20D1 and 20D2 that form the light receiving regions of the pixels PX1 and PX2, wherein the metal interconnection pattern M3 is connected to the gate electrode 20RG of the common reset transistor 20B at a contact 20c8.

Further, with the construction of FIG. 13, there extends the metal interconnection pattern M4 constituting the selection control line SEL of FIG. 1 continuously in the row direction, wherein the metal interconnection pattern M4 is branched in each column such that a tip end part of the branched pattern is connected to the gate electrode 20SG of the common select transistor 20S at a contact 20c7.

Further, with the construction of FIG. 13, it can be seen that the interconnection pattern 20h1 of FIG. 12 extends from the contact 20c1 in the row direction with a distance not interrupting the light receiving region, and an interconnection pattern 20h3 not shown in FIG. 12 is connected to the gate electrode 20FG of the reading transistor 20F at a contact 20c6.

Further, at the tip end part of the device region part 20W3, there is formed a lead interconnection pattern 20sig at the contact 20c3 so as to extend in the row direction for a limited length such that the lead interconnection pattern 20sig does not interrupt the light receiving region of the pixel elements PX1 and PX2, and a lead power supply interconnection pattern 20vr is formed to the contact 20c2 of the device region part 20W2 with a limited length in the column direction.

Figure 14:
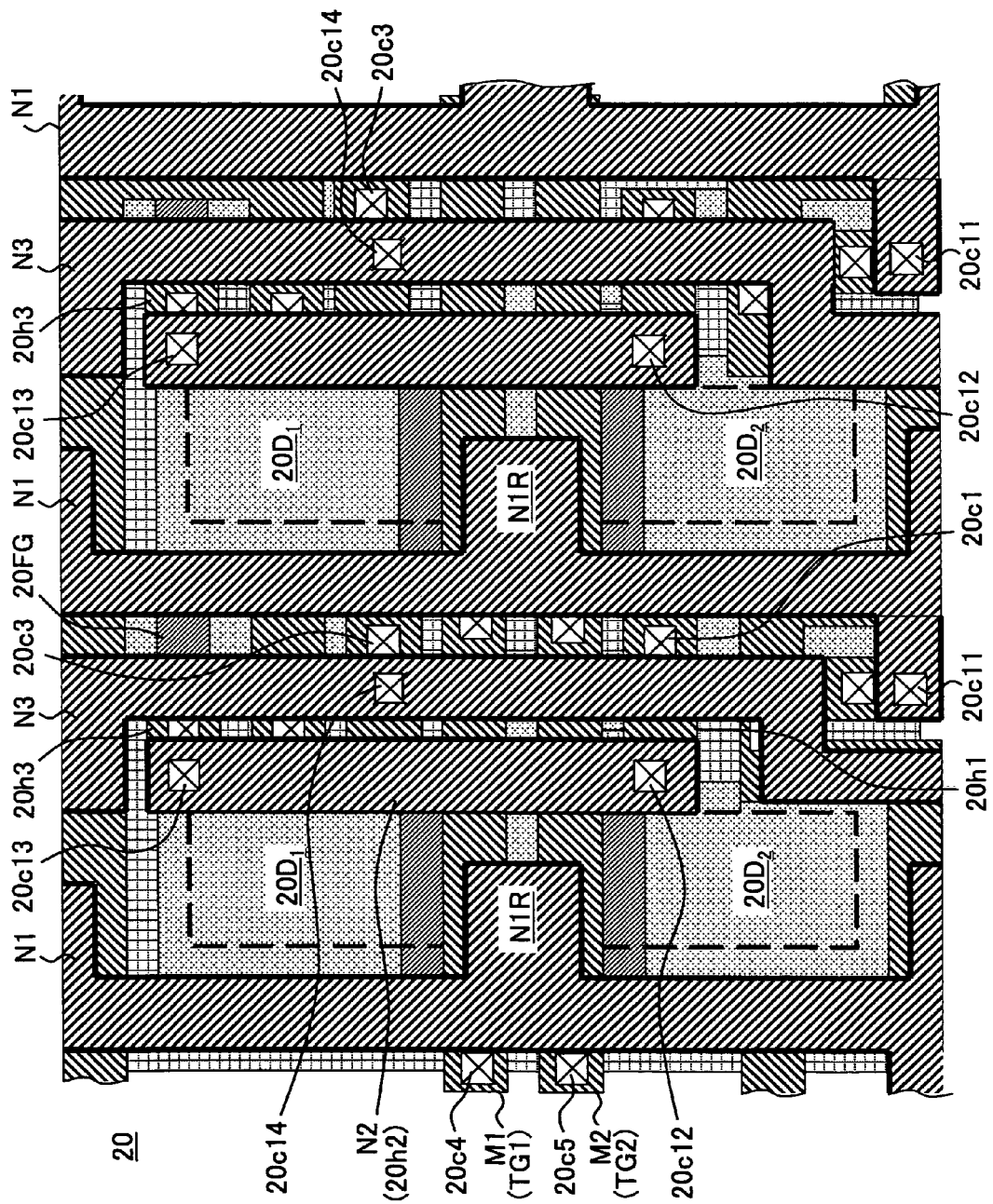
FIG. 14 is a diagram showing a second layer interconnection pattern used with the layout of FIG. 11.

FIG. 14 shows the second layer interconnection pattern.

Referring to FIG. 14, there extends a power supply interconnection pattern N1 in correspondence to the reset voltage line VR of FIG. 1 in the column direction, wherein the power supply interconnection pattern N1 is connected to the first layer lead interconnection pattern 20vr at a contact 20c11. With this, a supply voltage is supplied to power supply contact 20c2 formed in the device region part 20W3 via the lead interconnection pattern 20vr. It should be noted that the power supply interconnection pattern N1 is formed with a protrusion part N1R in correspondence to the common floating diffusion region FD. By forming such a protrusion part N1R, the common floating diffusion region FD is shaded.

Further, it should be noted that there extends a signal interconnection pattern N3 corresponding to the signal line SIG of FIG. 1 in the column direction, wherein the signal interconnection pattern N3 is connected to the lead interconnection pattern 20sig at a contact 20c14. With this, the output signal output from the common select transistor 20S to the contact 20c3 is supplied to the interconnection pattern 20sig via the contact 20c14.

Further, with FIG. 14, it will be noted that a metal interconnection pattern N2 corresponding to the interconnection pattern 20h2 extends between the interconnection pattern 20h1 connected to the common floating diffusion region FD at the single contact 20c1 and the interconnection pattern 20h3 connected to gate electrode 20FG of the reading transistor 20F at the contact 20c6, wherein the metal interconnection pattern N2 is connected to the interconnection pattern 20h1 at the contact 20c12 and the metal interconnection pattern N2 is connected to the interconnection pattern 20h3 at the contact 20c13.

Referring to FIG. 11 again, it can be seen that the diffusion regions 20D1 and 20D2 constituting the photodiode 10D of FIG. 5 are formed of an n-type diffusion region buried at a level deeper than the Si surface of the device region part 20W1 formed of an n-type diffusion region, and that the diffusion region 20D1 extends up to the region right underneath the gate electrode 20CG1 of the transfer gate transistor 20C1 of the pixel PX1 without changing the width measured in the row direction. Similarly, the diffusion region 20D2 extends up to the region right underneath the gate electrode 20CG2 of the transfer gate transistor 20C2 of the pixel PX2 without changing the width as measured in the row direction.

According to such a construction, the transfer transistor 20C1 or 20C2 has a channel width equal to the width of the diffusion region 20D1 or 20D2, and it becomes possible to transfer the photoelectrons formed at a pn junction of the diffusion region 20D1 or 20D2 to the common floating diffusion region FD efficiently.

Figure 7:
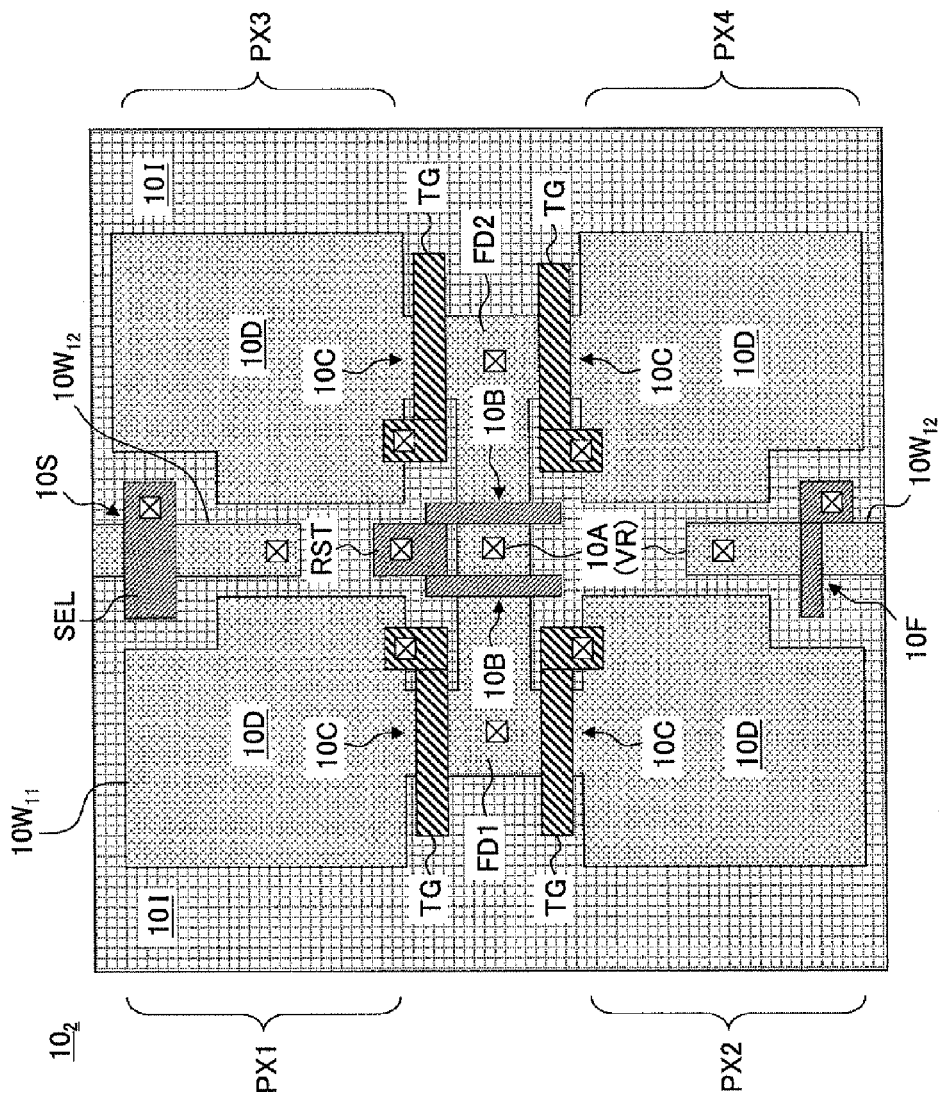
FIG. 7 is a diagram showing an example of the conventional layout of the CMOS imaging device that integrates four CMOS photosensors.
Figure 8:
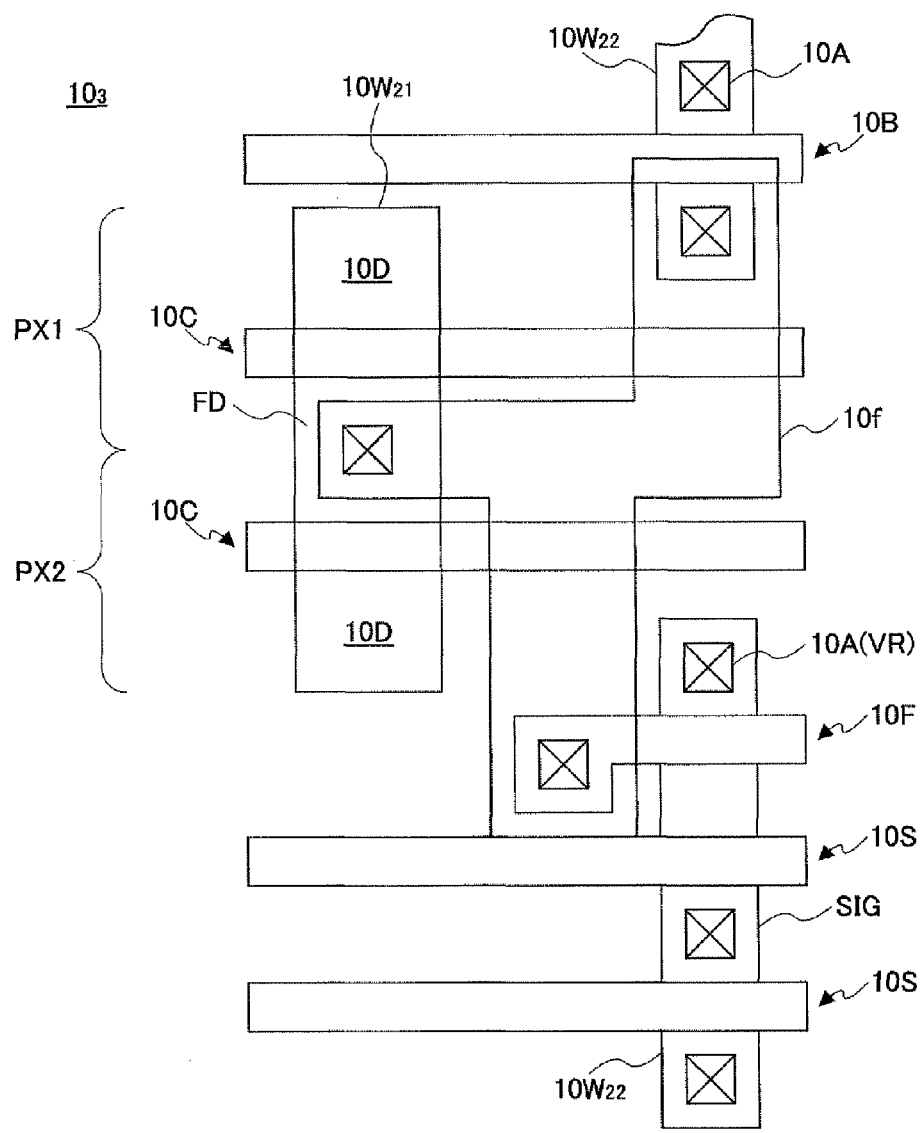
FIG. 8 is a diagram showing a conventional layout similar to FIG. 5.
Figure 9:
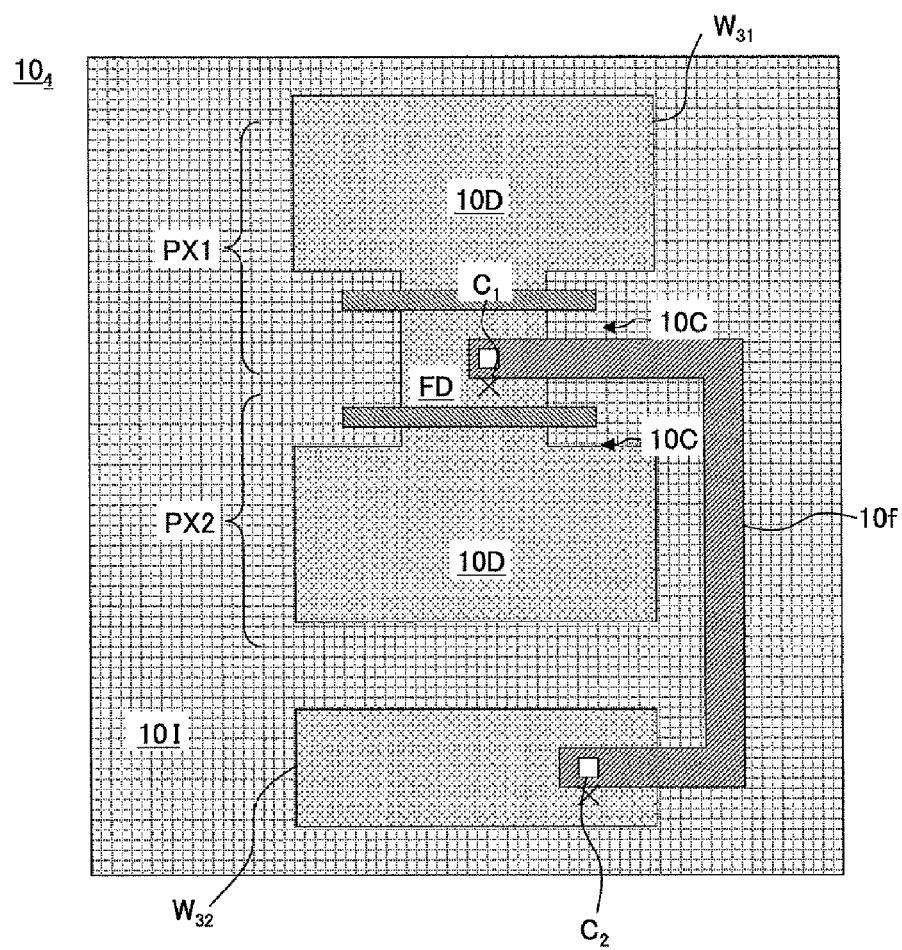
FIG. 9 is a diagram showing a further conventional layout.
Figure 10:
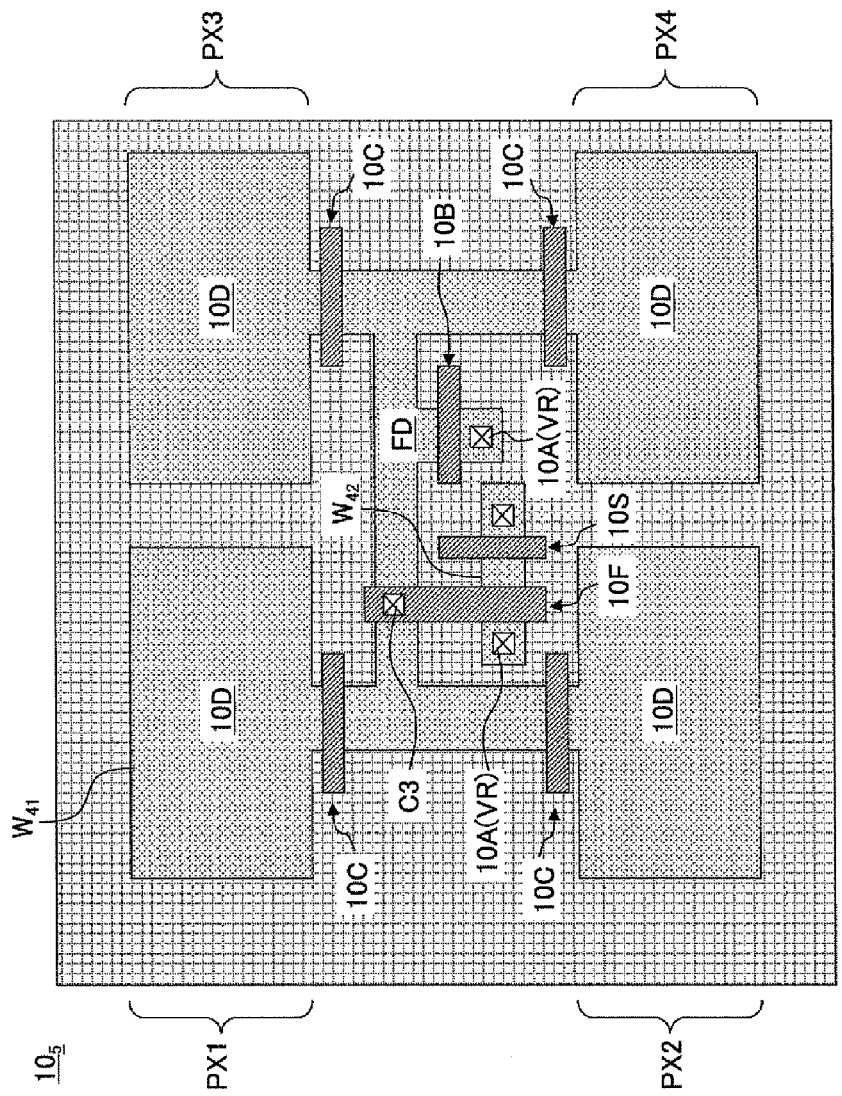
FIG. 10 is a diagram showing a further conventional layout.

Further, comparing with the layout of FIG. 7 explained previously, it can be seen that, with the construction of FIG. 7, the transfer gate transistor 10C is formed outside of the diffusion region 10D and the area of the diffusion region 10D, in other words, the detecting area, is sacrificed with that amount. With the construction of FIG. 11, on the other hand, it is possible to secure the largest detecting for the diffusion region 20D1 or 20D2. Further, with the construction of FIG. 11, the single contact 20c1 is formed in the device region part 20W3 branched out from the device region part 20W1. Thereby, there is formed no such a contact between the pair of diffusion regions that constitute the photodiode as in the case of the conventional art of FIG. 7 explained before. Thus, with the construction of FIG. 11, it is also possible to maximize the area of the diffusion region 20D1 and 20D2.

Referring to FIG. 14 again, it can be seen that the interconnection pattern N2 that connects the single contact 20c1 to the reading transistor 20S extends adjacent to the signal interconnection pattern N3, not the power supply interconnection pattern N1. Because the voltage change occurs in the same direction in the signal interconnection pattern N3 and the interconnection pattern N2 at the time of reading operation (Voltage of the pattern N3 rises when the voltage of the pattern N2 rises), there occurs no large change in the voltage difference between the patterns N2 and N3, and the capacitance between the patterns N2 and N3 do not contribute much to the electric charge-voltage transformation at the common floating diffusion region FD. Therefore, according to such a construction, the parasitic capacitance of the interconnection pattern N2 is reduced, and it becomes possible to reduce the problem of the voltage change induced at the common floating diffusion region FD by the photoelectrons is decreased by the parasitic capacitance of the signal interconnection pattern N3.

Hereinafter, the fabrication process of the CMOS imaging device of FIG. 11 will be explained with reference to FIGS. 15A-15H, wherein FIGS. 15A-15H show a cross-sectional view taken along lines A-B and C-D in FIG. 11.

Figure 15A:
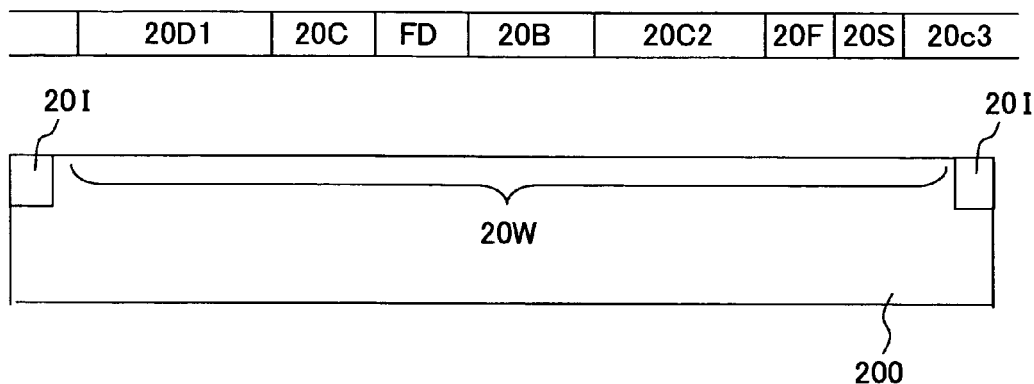
FIGS. 15A-15H are diagrams showing the fabrication process of the CMOS imaging device of FIG. 11.

Referring to FIG. 15A, the device isolation region 20I of STI structure defines the device region 20W on the silicon substrate 200, and the process below is conducted to form, in the device region 20W, the diffusion region 20D1 constituting the photodiode (PD) of pixel element PX1, the transfer gate transistor 20C1 of the pixel element PX1, the common floating diffusion region FD, the reset transistor 20B, the contact 20C2 to which the reset voltage (RST) is supplied, the source follower reading transistor 20F, the select transistor 20S, and the signal (SIG) take out contact 20c3, along the cross-section of FIG. 15A.

Figure 15B:
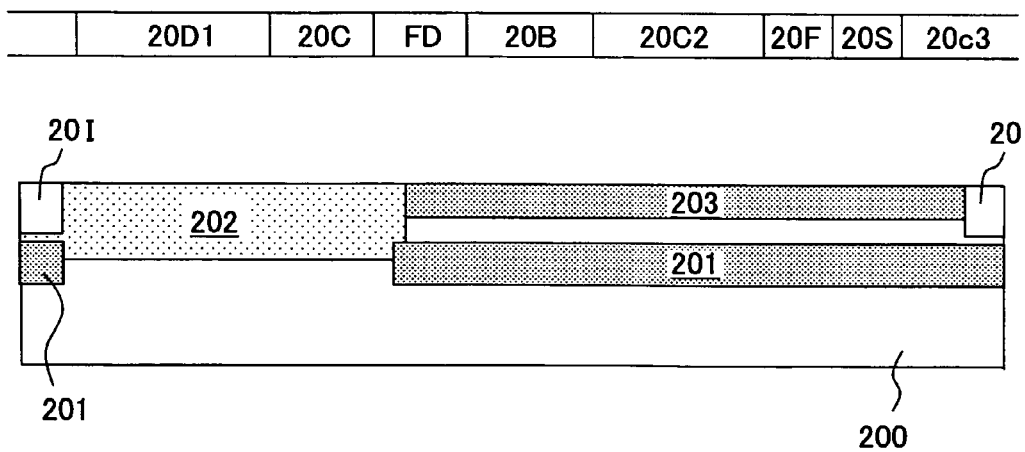

Thus, in the step of FIG. 15B, $B^+$ is introduced into the regions where common floating diffusion region FD, the reset transistor 20B, the contact 20C2, the reading transistor 20F, the select transistor 20S, and the contact 20c3 are to be formed, by an ion implantation process under the acceleration voltage of 300 keV with a dose of $1-3\times10^{13}$ cm$^{-2}$, and with this, a deep well 201 of p-type is formed in the device region parts 20W2 and 20W3 while avoiding the device region part 20W1.

Further, with the step of FIG. 15B, $B^+$ is introduced into the diffusion region 20D1 of the pixel element PX1 and the diffusion region 20D2 of and also the pixel element PX2, and further into the pixel element PX1 and the device region part 20W1 corresponding to the transfer gate transistor 20C of PX2, by an ion implantation process first under the acceleration voltage of 30 keV with the dose of $0.5-3\times10^{12}$ cm$^{-2}$, and then under the acceleration voltage of 150 keV with the dose of $1-2\times10^{12}$ cm$^{-2}$, and with this, there is formed a shallow p-type well 202 shallower than the p-type well 201.

Next, in the step of FIG. 15B, $B^+$ is introduced by an ion implantation process except for the region where the p-type well 202 is to be formed under the acceleration voltage of 30 keV with the dose of about $5\times10^{12}$ cm$^{-2}$, and a p-type well shallower than the well 202 is formed on the p-type well 201 for the purpose of threshold control of the reset transistor 20B and the reading transistor 20F.

Figure 15C:
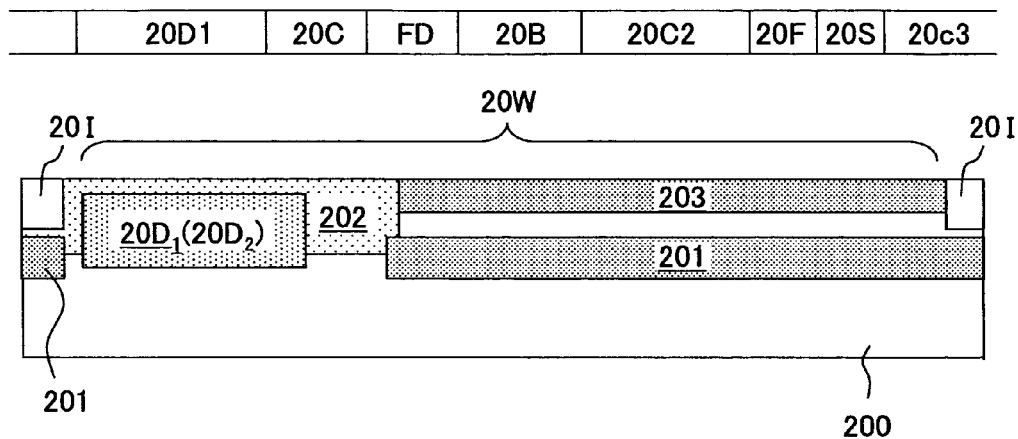

Next, in the step of FIG. 15C, $P^+$ is introduced into the p-type well 202 by an ion implantation process, first under the acceleration voltage of 135 keV with the dose of $1-2\times10^{12}$ cm$^{-2}$, and then under the acceleration voltage of 207 keV with the dose of $1-2\times10^{12}$ cm$^{-2}$, and further under the acceleration voltage of 325 keV with the dose of $1-2\times10^{12}$ cm$^{-2}$. With this, the n-type diffusion region 20D1 is formed in correspondence to the pixel element PX1 and the n-type diffusion region 20D2 in correspondence to the pixel element PX2 in the device region part 20W1, in the state buried in the p-type well 202. Here, it should be noted that the first ion implantation step of the foregoing ion implantation process conducted under the acceleration voltage of 135 keV may be conducted under the acceleration voltage of 250-300 keV while using As$^+$. Further, it is desirable to form the n-type diffusion region 20D1 (and also 20D2) in separation from the edge of the device isolation structure 20I that defines the well 202 by 0.2-0.3 µm.

In the step of FIG. 15C, there is formed a thermal oxide film of the thickness of about 8 nm (not shown) on the surface of the device region 20W after formation of the n-type diffusion regions 20D1 and 20D2 as the gate insulation film of the transfer gate transistors 20C1 and 20C2, the reset transistor 20B, the reading transistor 20F, and the select transistor 20S.

Figure 15D:
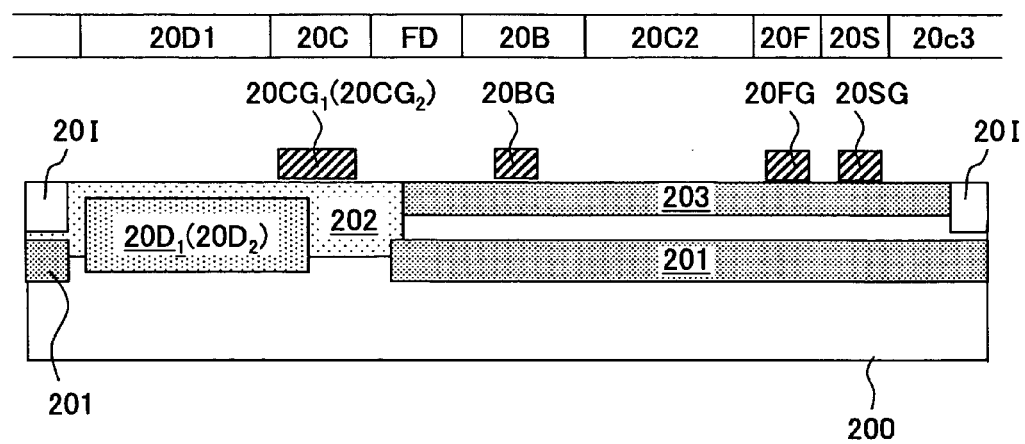

Next, in the step of FIG. 15D, a polysilicon film is deposited on the structure of FIG. 15C, and there are formed, in the device region part 20W1, the gate electrode 20CG1 of the transfer gate transistor 20C1 corresponding to the pixel element PX1 and the gate electrode 20CG2 of the transfer gate transistor 20C2 in the pixel element PX2 as a result of patterning thereof. At the same time, in the device region part 20W3, there are formed the gate electrode 20BG of the common reset transistor 20B, the gate electrode 20FG of the reading transistor 20F, and the gate electrode 20SG of the select transistor 20S.

Figure 15E:
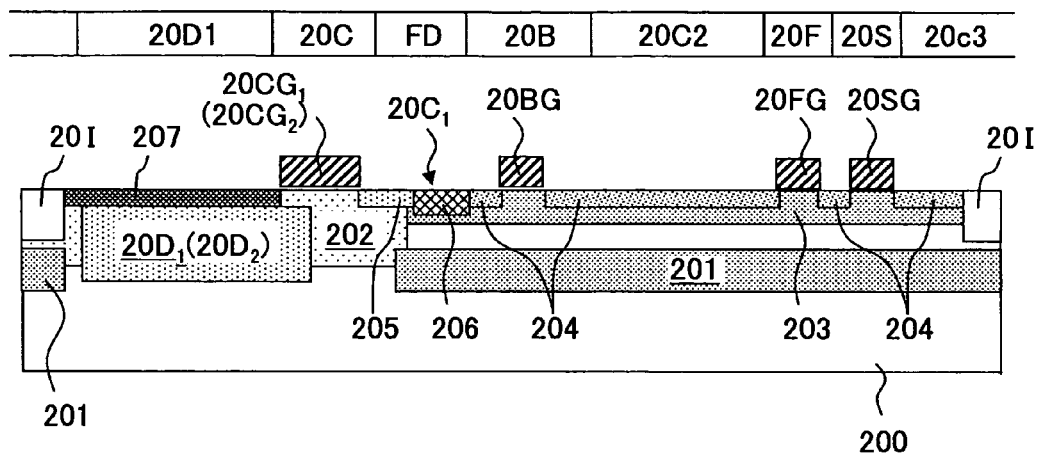

Next, in the step of FIG. 15E, the device region part 20W1 is protected with a resist pattern, and P$^+$ is introduced into the device region parts 20W2 and 20W3 in this state under the acceleration voltage of about 20 keV with the dose of $4 \times 10^{13}$ cm$^{-2}$. With this, the n-type diffusion region 204 that serves for the LDD region of the transistors 20B, 20F and 20S is formed.

Further, in the step of FIG. 15E, P$^+$ is introduced into the common floating diffusion region FD in the device region part 20W1 by an ion implantation process while using the gate electrode 20CG1 or 20CG2 as a self-alignment mask and avoiding the n-type diffusion regions 20D1 and 20D2 of the photodiode PD, under the acceleration voltage of 20 keV with the dose of $5 \times 10^{12}$–$5 \times 10^{14}$ cm$^{-2}$. With this, the LDD region 205 of the transfer gate transistor 20C1 or 20C2 is formed at the opposite side of the n-type diffusion region 20D1 or 20D2.

In the step of FIG. 15E, there is formed a single highly doped diffusion region 206 in the device region part 20W3 in correspondence to contact 20c1 by an ion implantation process of P$^+$ conducted under the acceleration voltage of 15 keV with large dose of about $2 \times 10^{15}$ cm$^{-2}$. Thereby, it is preferable to form the highly doped diffusion region 206 with separation of 0.2 μm or more from any of the reset transistor 20B and the transfer gate transistors 20C1 and 20C2 such that the characteristics of these transistors are not affected.

Further, in the step of FIG. 15E, the device region parts 20W2 and 20W3 are protected with a resist pattern and B+ is introduced into the device region part 20W1 by an ion implantation process under the acceleration voltage of 5-10 keV with the dose of $1 \times 10^{13}$-$5 \times 10^{13}$ cm$^{-2}$ while using the gate electrodes 20CG1 and 20CG2 of the transfer gate transistors 20C1 and 20C2 as a mask. With this, there is formed a screening layer 207 of p$^+$-type between the n-type diffusion region 20D1 or 20D2 and the silicon substrate surface.

By forming such a screening layer 207, the depletion layer that extends from the n-type diffusion region 20D1 or 20D2 is confined in the vicinity of the p-n junction between the diffusion region 20D1 or 20D2 and the screening layer 207, and the depletion layer no longer reaches the silicon/thermal oxide film interface of the silicon substrate surface. With this, it becomes possible to suppress the dissipation of photoelectrons by way of junction leakage caused via such a depletion layer.

Figure 15F:
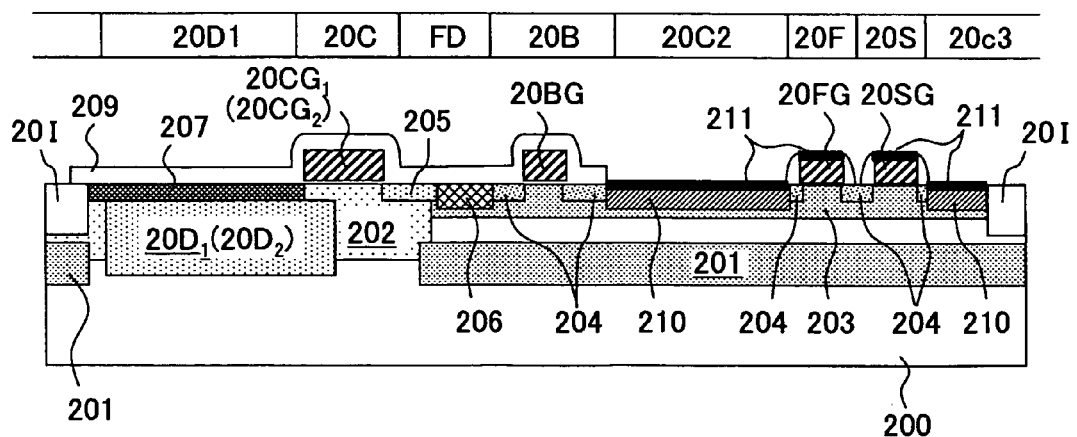

Next, in the process of FIG. 15F, there is deposited a silicon oxide film 209 with the thickness of about 100 nm on the structure of FIG. 15E by a CVD process so as to cover the gate electrodes 20CG1, 20CG2, 20BG, 20FG and 20SG uniformly, and the region of the device region part 20W3 at the tip side of the reset transistor 20BG including the formation region of the contact 20C2 is etched back by a mask process. With this, sidewall insulation films are formed on the gate electrodes 20FG and 20SG, and at the same time, the part of the LDD region 204 corresponding to the formation region of the contact 20C2 and the source and drain regions of the transistors 20F and 20S is exposed.

With the step of FIG. 15F, P$^+$ is introduced into the exposed part by an ion implantation process while using gate electrodes 20FG and 20SG as self-aligned mask under the acceleration voltage of 15 keV with the dose of about $2 \times 10^{15}$ cm$^{-2}$. Thereafter, thermal annealing process is conducted at the temperature of 1000° C. for 10 seconds, and with this, there is formed a diffusion region 210 of n$^+$-type that serves for the source and drain regions of the transistors 20F and 20D.

In this state, it should be noted that the CVD insulation film 209 is formed on the silicon substrate 200 so as to expose the n$^+$-type diffusion region 210 and the gate electrodes 20FG and 20SG as shown in FIG. 15F. In the step of FIG. 15F, there is further deposited a metal film such as Co (not shown) uniformly with the thickness of typically 10 nm by sputtering.

Further, by annealing the silicon substrate 200 by an RTA process at the temperature of 500-600° C. for several ten seconds, there is formed a cobalt silicide film on the surface of the diffusion region 210 and also on the surface of the gate electrodes 20FG and 20SG.

In the step of FIG. 15F, the unreacted Co film is removed thereafter, and by conducting a thermal annealing by an RTA process at 800-900° C. for several ten seconds, the cobalt silicide film 211 is changed to a low-resistance silicide film represented as CoSi$_2$. For the sake of simplicity, such a silicide layer 211 is not shown in the plan view of FIG. 11.

Figure 15G:
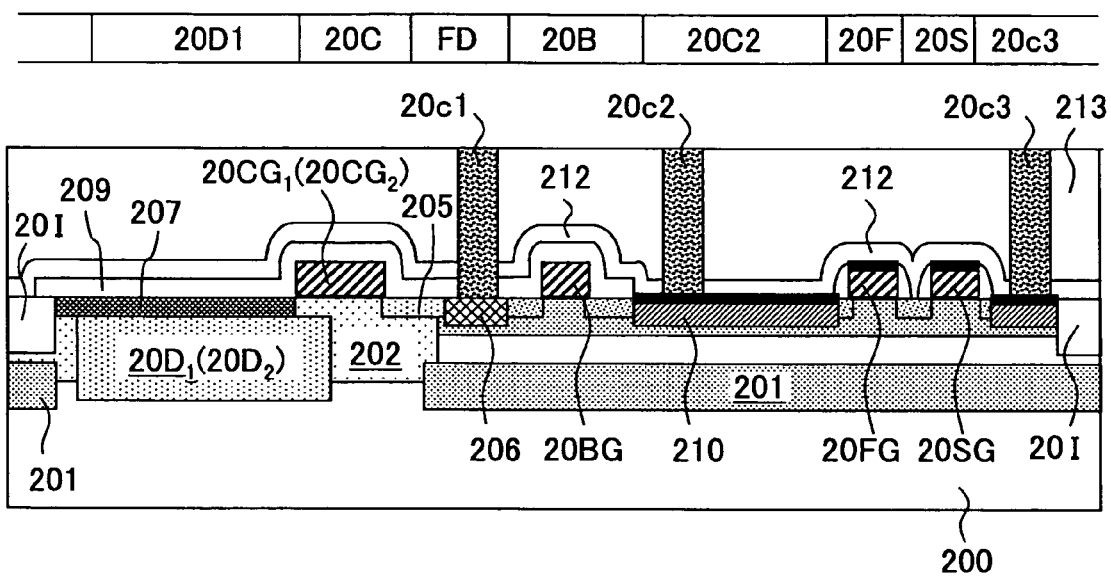

Next, in the step of FIG. 15G, an SiN film 212 is deposited on the structure of FIG. 15F with the thickness of 70 nm as an anti-reflection coating by a plasma CVD process, and an SiO$_2$ interlayer insulation film 213 is formed on the SiN film 212 by a plasma CVD process with the film thickness of about 1000 nm.

Further, in the interlayer insulation film 213, there are formed contact holes so as to expose the n$^+$-type diffusion region 205 formed in the device region part 20W3, the source region of the reset transistor 20B and the drain region of the select transistor 20S, and conductor plugs forming the contacts 20c1, 20c2 and 20c3 are formed by filling the contact holes with a low resistance metal such as W via a barrier metal film such as Ti/TiN (not shown).

Thereby, it should be noted that the silicide layer 211 is formed in the formation region of the contacts 20c2 and 20c3 while no such a silicide layer 211 is formed in the formation region of the contact 20c1. Because of this, it is preferable to form the contact hole corresponding to the contact 20c1 in the interlayer insulation film 213 with an optimized process in advance and then form the contact holes corresponding to the contacts 20c2 and 20c3 later.

Figure 15H:
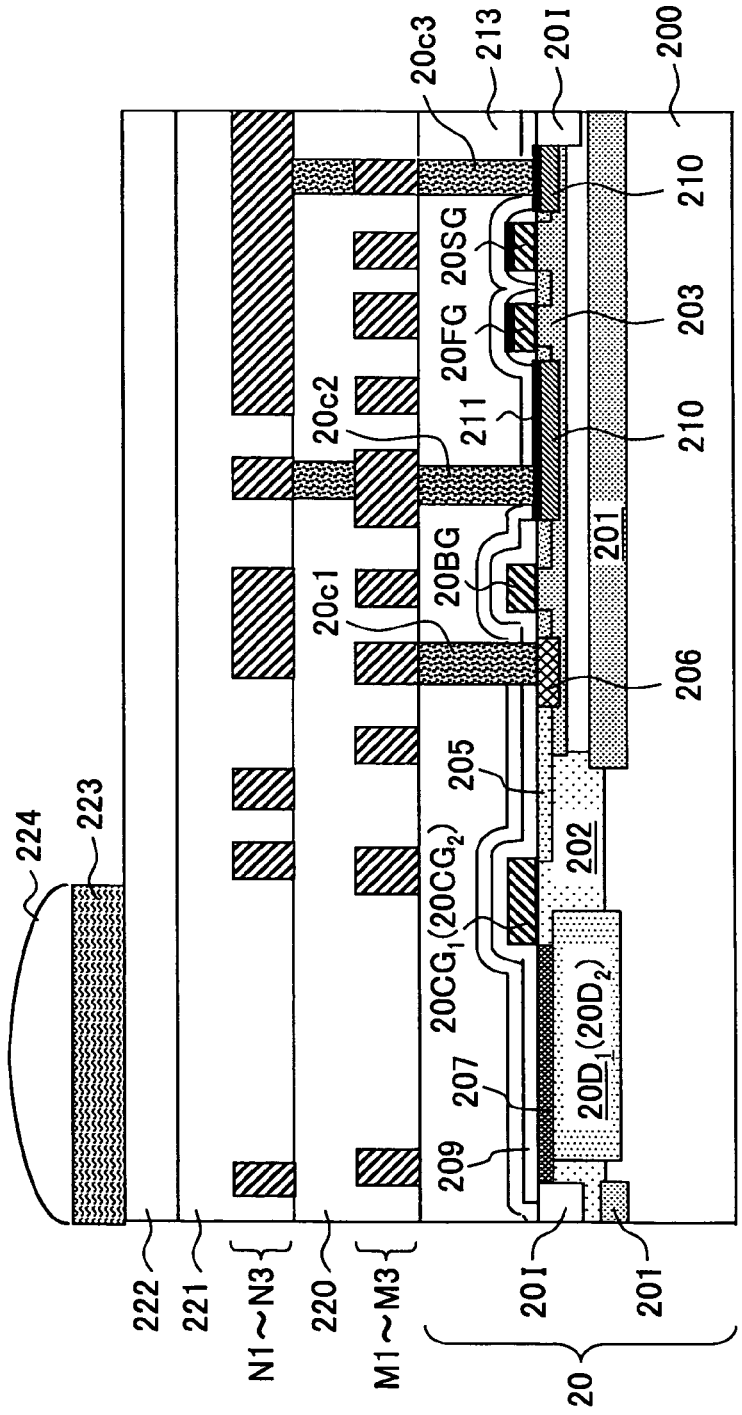

FIG. 15H shows a cross-sectional view of the CMOS imaging device 20 thus formed with the layout of FIG. 11 taken along the line A-B-C-D.

Referring to FIG. 15H, there is formed, on the structure of FIG. 15, a multilayer interconnection structure formed of an interconnection layer 220 that includes the first layer metal interconnection layers M1-M3 shown in FIG. 13 and an interconnection layer 221 that includes the second layer metal interconnection layers N1-N3 shown in FIG. 14, and an SiN cover film 222 is formed on the multilayer interconnection structure by a plasma CVD process.

Further, a micro lens 224 is formed on the SiN cover film 222 corresponding to each of the photodiode diffusion regions 20D1 and 20D2 of the pixels PX1 and PX2.

Second Embodiment

Figure 16:
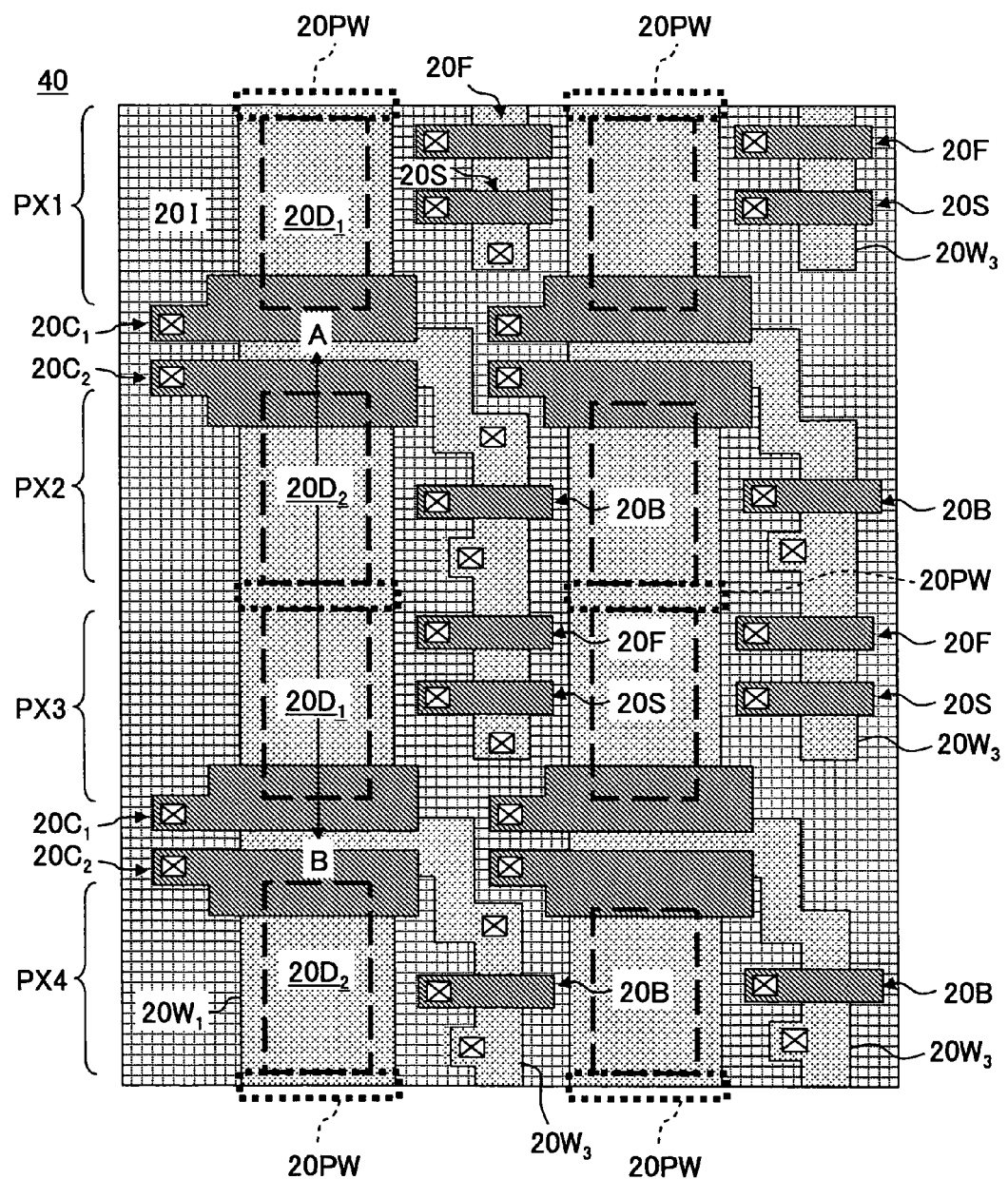
FIG. 16 is a diagram showing the layout of a CMOS imaging device according to a second embodiment mode of the present invention.

FIG. 16 shows the construction of a CMOS device 40 according to a second embodiment of the present invention, wherein those parts of FIG. 16 corresponding to those parts explained previously are designated with the same reference numerals and the description thereof will be omitted.

Referring to FIG. 16, the device region part 20W1 forms a band-like region that extends over the silicon substrate surface continuously in the column direction in this embodiment, wherein it can be seen, in the construction of FIG. 16, that there is formed a p-type well 20PW between the pixel PX2 and the pixel PX3, which is adjacent to the pixel PX2 in the column direction and in separation by the device isolation insulation film 20I in the construction of FIG. 12, for the purpose of device isolation.

Figure 17:
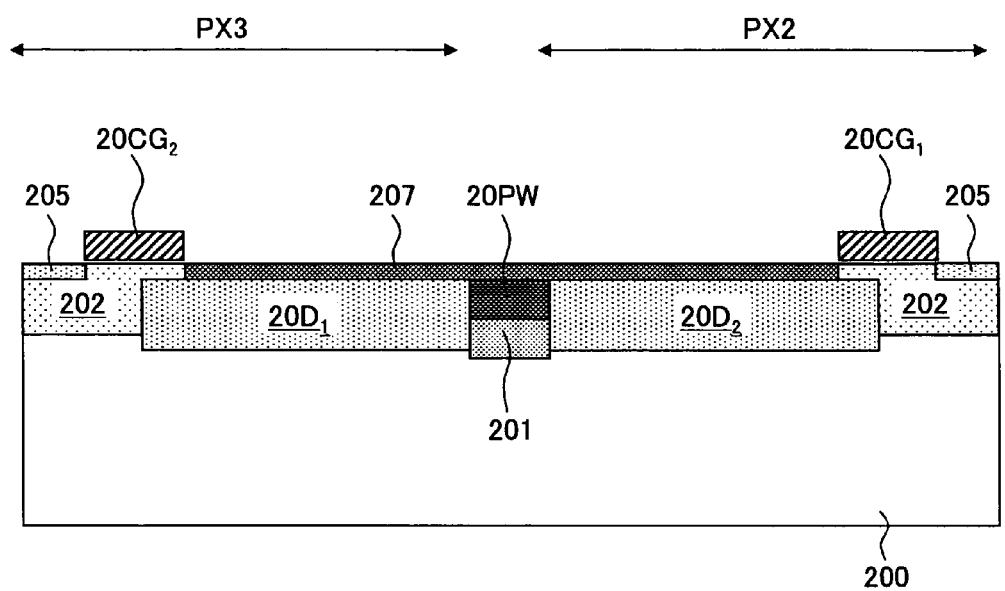
FIG. 17 is a diagram showing a cross-section of a part of FIG. 16.

FIG. 17 shows the cross-sectional view taken along a line A-B of FIG. 16.

Referring to FIG. 17, it can be seen that the p-type device isolation well 20PW is formed between the diffusion region 20D2 constituting the photodiode PD in the pixel PX2 and the diffusion region 20D1 constituting the photodiode PD in the pixel PX3 with the width of about 0.4-0.5 μm, by introducing B+ by an ion implantation process first under the acceleration voltage of 150 keV with the dose of $3 \times 10^{12}$ cm$^{-2}$, and then under the acceleration voltage of 30 keV with the dose of $5 \times 10^{12}$ cm$^{-2}$, In the case of achieving the device isolation between the diffusion region 20D2 of the pixel PX3 and the diffusion region 20D1 of the pixel PX2 by the STI device isolation structure 20I as in the case of the previous embodiment, it should be noted that there is a need of securing the distance of 0.2-0.3 μm for the device isolation structure 20I in addition to the width of 0.25-0.3 μm of the device isolation structure 20I itself for covering the extent of the depletion layer between the diffusion region 20D1 or 20D2 and the device isolation structure 20I, while this means that a gap of the 0.65-0.9 μm in all is formed between the foregoing diffusion regions 20D1 and 20D2. According to the present embodiment, on the other hand, it is possible to reduce the foregoing gap, and the resolution of the CMOS imaging device is improved. Alternatively, it becomes possible to increase the area of the diffusion regions 20D1 and 20D2.

Third Embodiment

Figure 18:
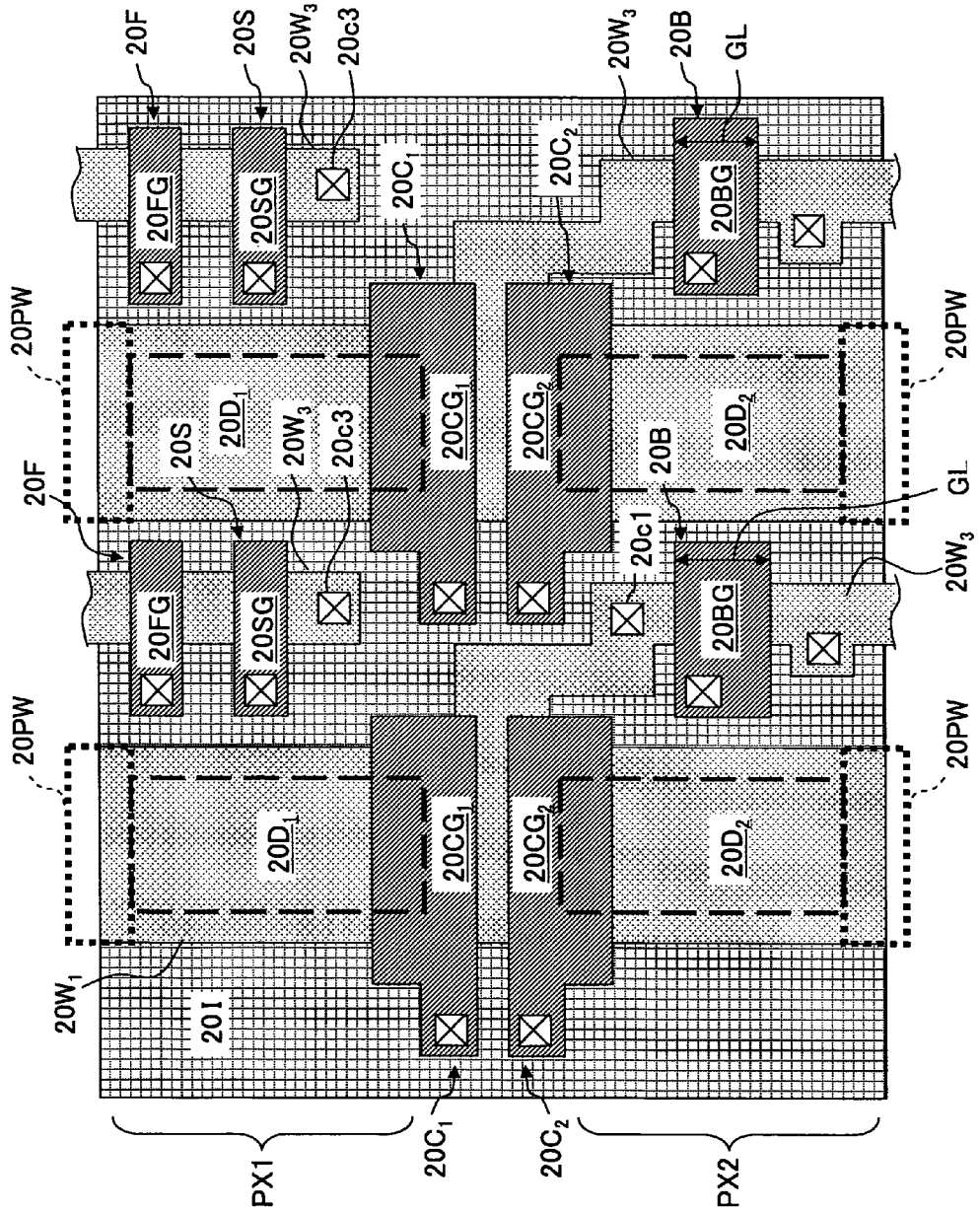
FIG. 18 is a diagram showing the layout of a CMOS imaging device according to a third embodiment of the present invention.

FIG. 18 is a plan view diagram showing the layout of a CMOS imaging device 60 according to a third embodiment of the present invention wherein those parts of drawing explained previously are designated by the same reference numerals and the description thereof will be omitted.

Referring to FIG. 18, the present embodiment sets the gate length of the reset transistor 20B to the value of the 0.9 μm, for example, which is larger than any other transistors, such as the transfer gate transistors 20C1 and 20C2, the reading transistor 20F or the select transistor 20S. Further, ion implantation dedicated for the reset transistor is conducted into the device region of the reset transistor 20B, in which the area is increased as a result of such increase of the gate length, for the purpose of threshold control. With this, the threshold voltage of the transistor 20B is decreased to about 0.1V. For example, ion implantation of As+ is conducted to the region of the reset transistor 20B right underneath the gate electrode 20BG under the acceleration voltage of 50 keV with the dose of $2-4 \times 10^{12}$ cm$^{-2}$.

In the illustrated example, for example, the reset transistor 20B has a gate length GL of 0.9 μm, while the transfer gate transistors 20C1 and 20C2 have the gate length of 0.75 μm. Further, the reading transistor 20F has the gate length of 0.50 μm, while the select transistor 20S has the gate length of 0.34 μm.

According to such a construction, the variation of characteristics is reduced for the reset transistor 20B in spite of the low threshold voltage, and it becomes possible to reset the common floating diffusion region FD with low reset control voltage even in the case the CMOS imaging device 60 is operated at low voltage. Alternatively, it becomes possible to write the floating diffusion region FD to high (reset) voltage by using the same reset control voltage.

According to the present embodiment, in which the reset transistor 20B, the reading transistor 20F and the select transistor 20S are formed in the single device region part 20W3 branched out from the device region part 20W1 via the device region part 20W2, a high efficiency of area utilization is realized on the semiconductor substrate 200, and sufficient margin for increasing the gate length GL of the reset transistor 20B is secured.

Fourth Embodiment

Figure 19:
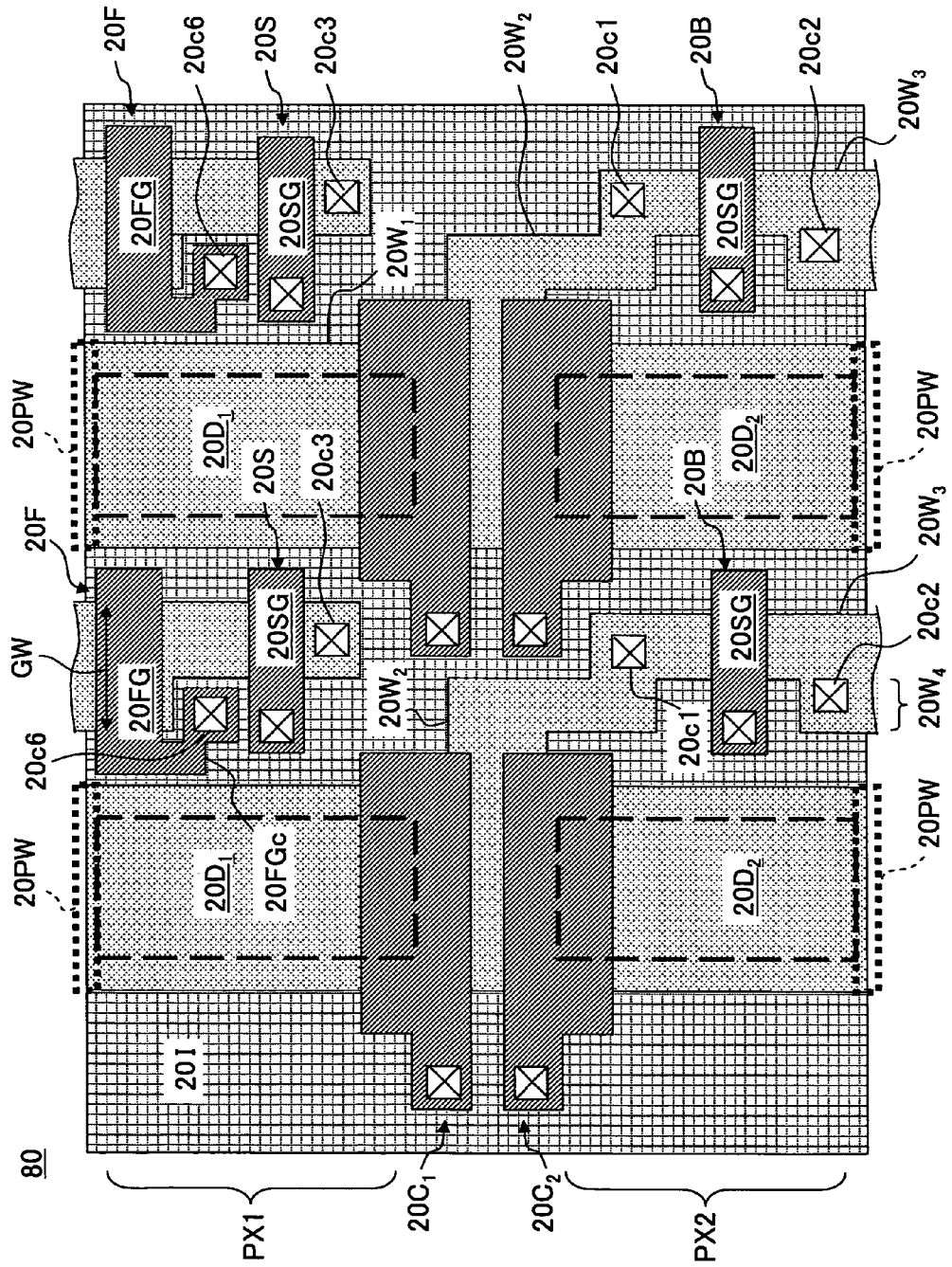
FIG. 19 is a diagram showing the layout of a CMOS imaging device according to a fourth embodiment of the present invention.

FIG. 19 is a plan view diagram showing the layout of a CMOS imaging device 80 according to a fourth embodiment of the present invention wherein those parts of FIG. 19 explained previously are designated by the same reference numerals and the description thereof will be omitted.

Referring to FIG. 19, the region 20W4 of the device region part 20W3 in which the width is increased for formation of the single power supply contact 20c2 extends with the present embodiment along the device region 20W3 in the column direction up to the formation region of the reading transistor 20F, wherein the reading transistor 20F is formed to have a larger gate width GW than the reading transistor of the previous embodiment.

Because of this, the gate electrode 20FG of the reading transistor 20F comes close to the adjacent device region 20W1 and it is no longer possible to form the gate contact 20c6.

On the other hand, with the CMOS imaging device 80 of the present invention, in which the reset transistor 20B, the reading transistor 20F and the select transistor 20S are formed in the single device region part 20W3 branched out from the device region part 20W1 via the device region part 20W2, there remains an available space on the device region part 20W3, and thus, the illustrated example forms a lead part 20FGc so as to extend from the gate electrode 20FG in the column direction and form the contact 20c6 in such a lead part 20FGc.

According to the present embodiment, the variation of characteristics of the reading transistor 20F is reduced because of the increased gate width of the reading transistor 20F.

Fifth Embodiment

Figure 20:
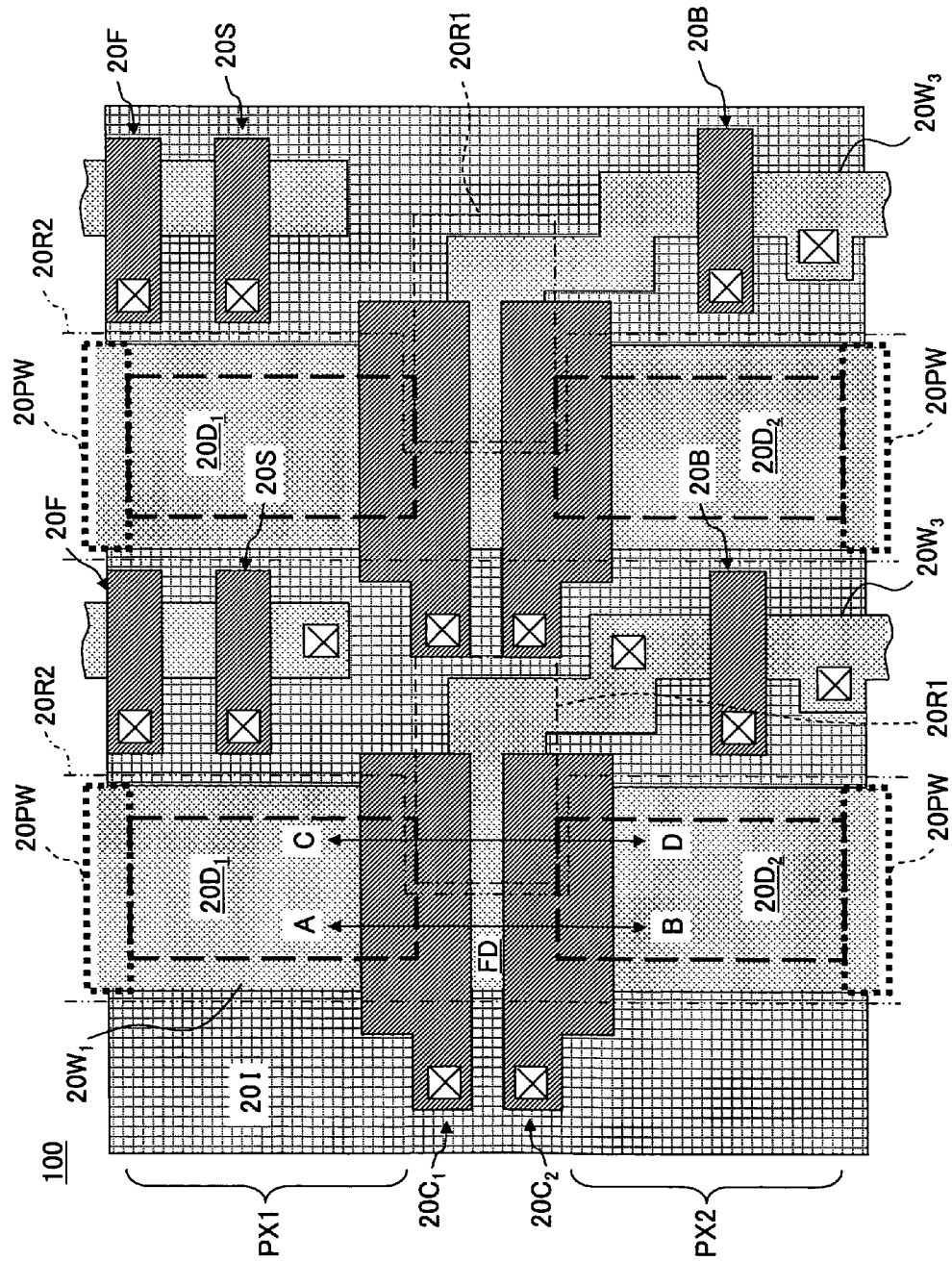
FIG. 20 is a diagram showing the layout of a CMOS imaging device according to a fifth embodiment of the present invention.

FIG. 20 shows the construction of a CMOS imaging device 100 according to a fifth embodiment of the present invention, wherein those parts of FIG. 20 explained previously are designated by the same reference numerals and the description thereof will be omitted.

Referring to FIG. 20, the CMOS imaging device 100 has a construction similar to the CMOS imaging device 40 explained in FIG. 16 previously, except that LDD regions 205 of the transfer gate transistors 20C1 and 20C2 are formed in a region 20R1, enclosed by a one-dotted chain line, of the device region part 20W2 branching out from the common floating diffusion region FD between the pixels PX1 and PX2 and the device region part 20W1, by ion implantation of P+, for example. The ion implantation process for forming the LDD regions 205 may be conducted under the condition explained previously with reference to FIG. 15E.

Thus, with the present embodiment, a mask process is used in the step of FIG. 15E when forming the screening layer 207 by the ion implantation of B+, such that the ion implantation of B+ is conducted only to the region 20R2 shown in FIG. 20 by a two-dotted chain line while avoiding the region 20R1.

Figure 21A:
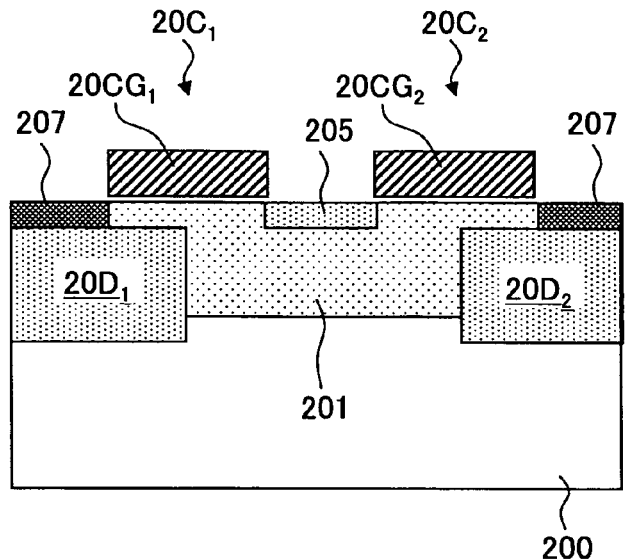
FIG. 21A is a diagram showing a cross-section of FIG. 20 taken along a line C-D.
Figure 21B:
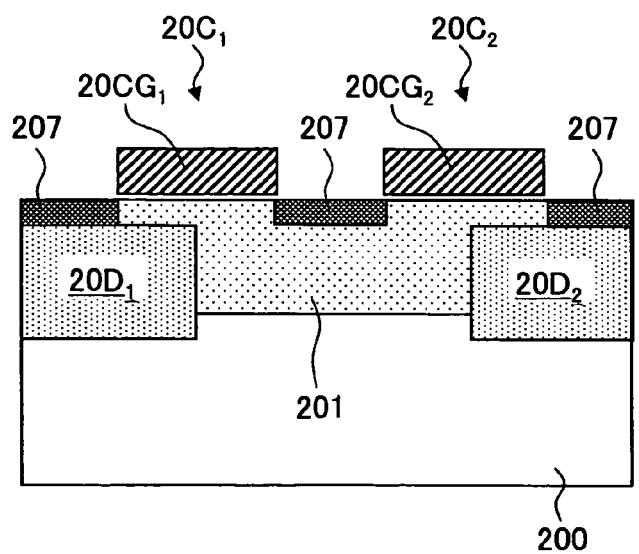
FIG. 21B is a diagram showing a cross-section of FIG. 20 taken along a line A-B.

As a result of such an ion implantation process, there is formed a structure having a cross-section shown in FIG. 21A and FIG. 21B in the device region 20W1, wherein FIG. 21B shows the cross-section of FIG. 20 taken along the line A-B, while FIG. 21A shows a cross-section of FIG. 20 taken along the line C-D.

By forming the LDD region 205 so as to invade into the device region part 20W1 as such, the area of the common floating region FD is decreased, and the overlapping length, in which the foregoing common floating region FD overlapping with the gate electrode of the transfer gate transistor 20C1 or 20C2 is decreased. As a result, the capacitance of the common floating diffusion region FD is decreased, and it becomes possible to increase to the voltage signal occurring in the common floating diffusion region FD by the transferred photoelectrons.

With the construction of FIG. 20, it is preferable to form the region 20R1 and the region 20R2 with a separation of about 0.2 μm. Further, with the present embodiment, the ion implantation process for the formation of the screening layer 207 in the region 20R2 may be omitted if necessary.

Sixth Embodiment

Figure 22:
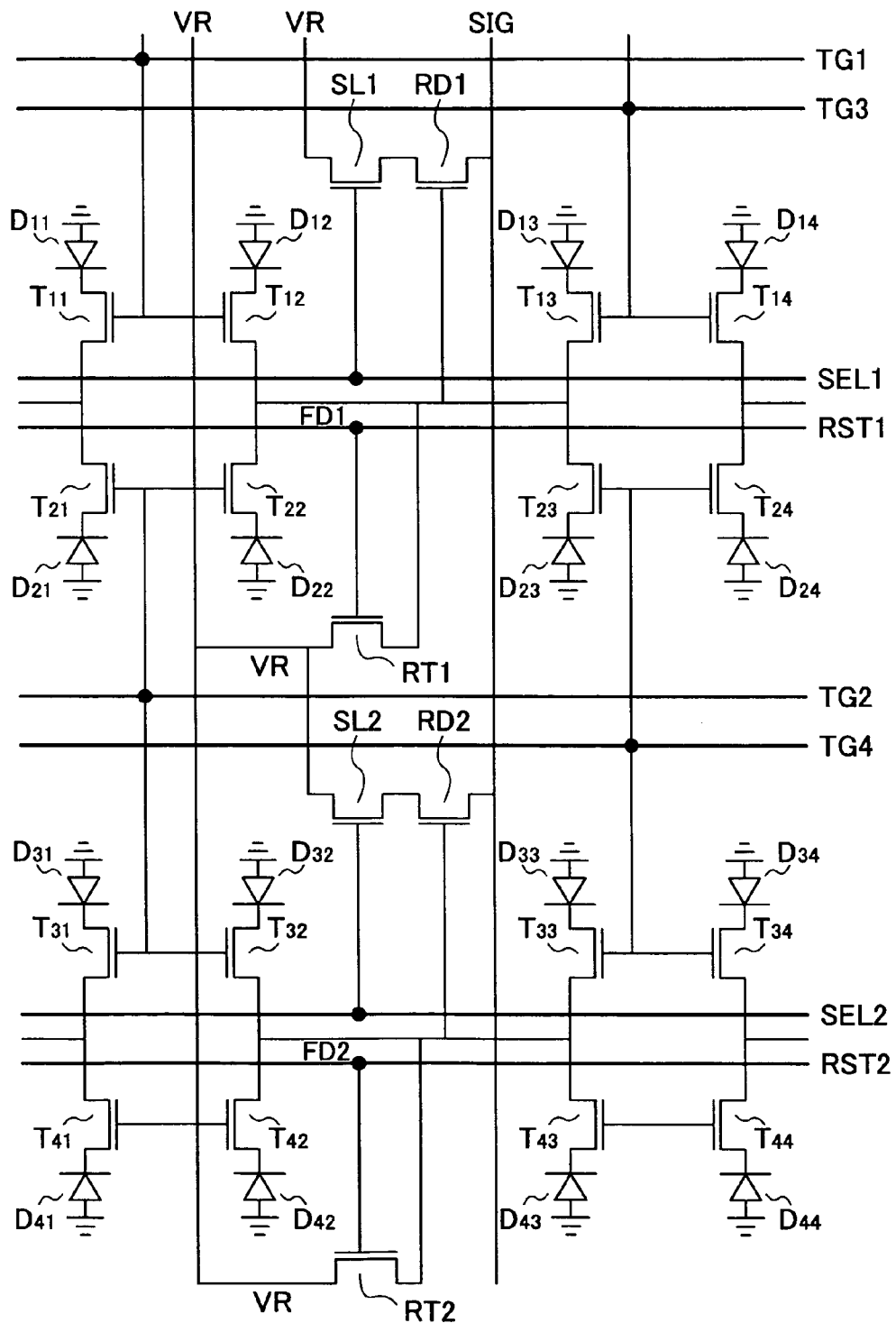
FIG. 22 is a diagram showing an equivalent circuit of a CMOS imaging device according to a 6th embodiment of the present invention.

FIG. 22 is an equivalent circuit diagram showing the construction of a CMOS imaging device 120 according to a sixth embodiment of the present invention.

Referring to FIG. 22, the CMOS imaging device 120 includes, on a semiconductor substrate, a row-and-column formation of the transfer gate transistors T11, T12, T13, T14, . . . , T21, T22, T23, T24, . . . , T31, T32, T33, T34, . . . , T41, T42, T43, T44, . . . , wherein the transfer gate transistors T11, T12, T13, T14, . . . T21, T22, T23, T24, . . . T31, T32, T33, T34, . . . T41, T42, T43, T44, . . . have respective sources formed with photodiodes D1, D12, D13, D14, . . . , D21, D22, D23, D24, . . . D31, D32, D33, D34, . . . D41, D42, D43, D44, . . . .

Among these, the transfer gate transistors T11 and T12, T13 and T14, T21 and T22, T23 and T24, T31 and T32, T33 and T34, T41 and T42, T43 and T44, have the respective gates connected commonly to each other, wherein the gates of the transfer gate transistors T11 and T12 are connected to a transfer control line TG1, the gate of the transfer gate transistors T13 and T14 are connected to the transfer control line TG3, the gate of the transfer gate transistors T21 and T22 are connected to the transfer control line TG2, and the gates of the transfer gate transistors T23 and T24 are connected to transfer control line TG4.

Similarly, the gates of the transfer gate transistors T31 and T32 are connected to the transfer control line TG2, the gates of the transfer gate transistors T33 and T34 are connected to the transfer control line TG4, the gates of the transfer gate transistors T41 and T42 are connected to the different transfer control line not illustrated, and the gates of the transfer gate transistors T43 and T44 are connected to a further different transfer control line.

Further, the drains of the transfer gate transistors T12, T13, T22, T23 form together a common floating diffusion region FD1, wherein the common floating diffusion region FD1 is reset by a reset transistor RT1. It should be noted that the reset transistor RT1 is controlled by a reset signal on the reset control line RST1, which extends in the row direction and connected to the reset voltage line VR, while the reset voltage line VR extends in the column direction.

Similarly, the drains of the transfer gate transistors T32, T33, T42, T43 form together a common floating diffusion region FD2, wherein the common floating diffusion region FD2 is reset by a reset transistor RT2. It should be noted that the reset transistor RT2 is controlled by a reset signal on the reset control line RST2, which extends in the row direction and connected to the reset voltage line VR, while the reset voltage line VR extends in the column direction.

Further, commonly to the transfer gate transistors T12, T13, T22 and T23, there is provided a select transistor SL1 connected to the reset voltage line VR such that the select transistor SL1 is controlled by a selection control signal on a selection control line SEL1 that extends in the row direction, wherein there is provided a reading transistor RD1 having the gate thereof connected to the common floating diffusion region FD1, in series connection to the selection transistor SL1. The reading transistor RD1 forms a source follower circuit and provides an output signal on the signal line SIG extending in the column direction.

Further, there is provided a select transistor SL2 connected to the reset voltage line VR commonly to the transfer gate transistors T32, T33, T42 and T43, such that the select transistor SL2 is controlled by a selection control signal on a selection control line SEL2 that extends in the row direction, wherein there is provided a reading transistor RD2 having the gate thereof connected to the common floating diffusion region FD2, in series connection to the selection transistor SL2. The reading transistor RD2 forms a source follower circuit and provides an output signal on the signal line SIG extending in the column direction.

Figure 23:
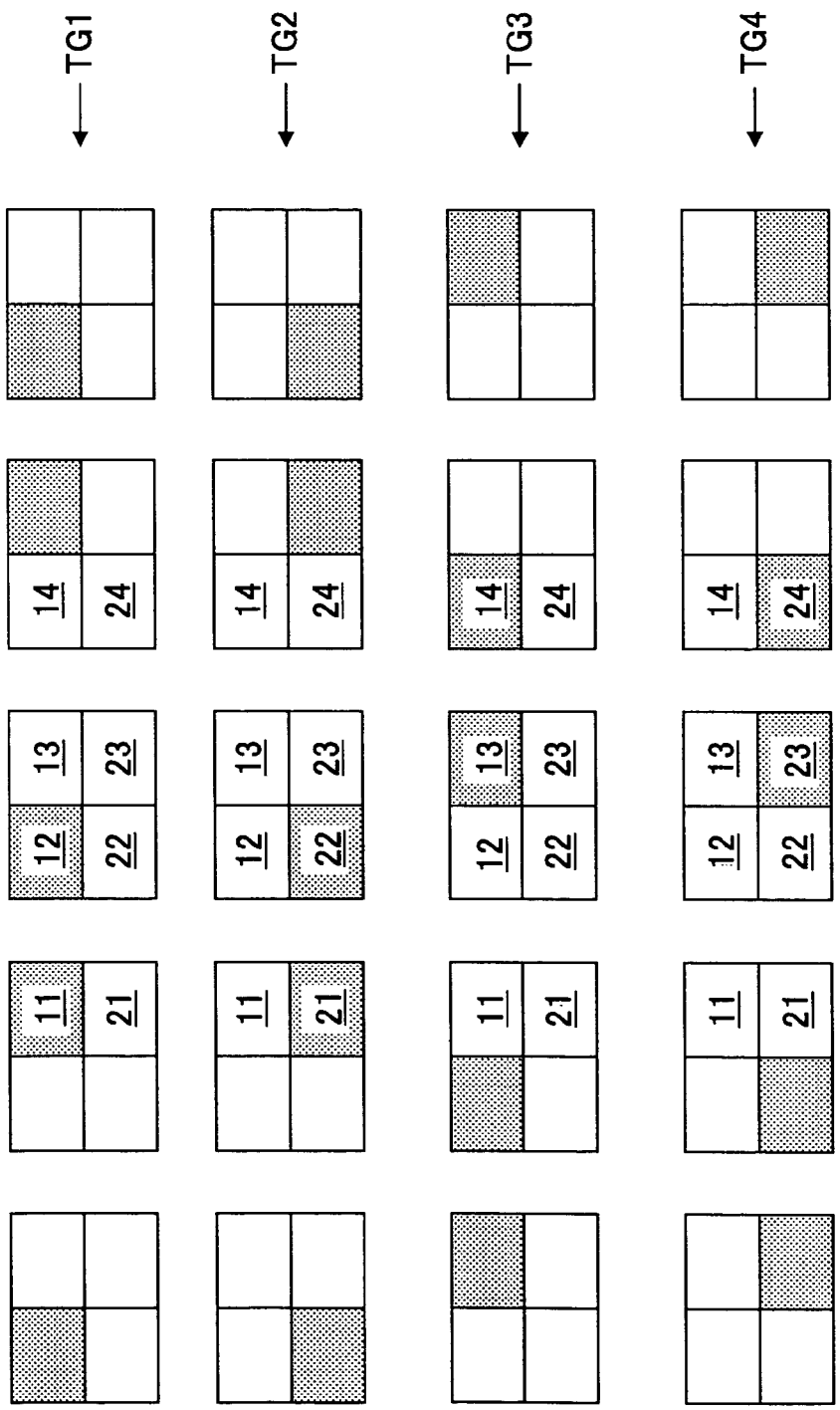
FIG. 23 is a diagram explaining a reading operation in the CMOS imaging device of FIG. 22.

FIG. 23 shows a pixel read out by the selection signal on the transfer control lines TG1-TG4 shown in FIG. 22. In FIG. 23, it should be noted that those pixels sharing a common reading circuit including the transistor is surrounded by a line in the representation. For example, "11" represents the pixel having the photodiode D11, while "12" show the pixel that have the drawing photodiode D12.

Figure 24:
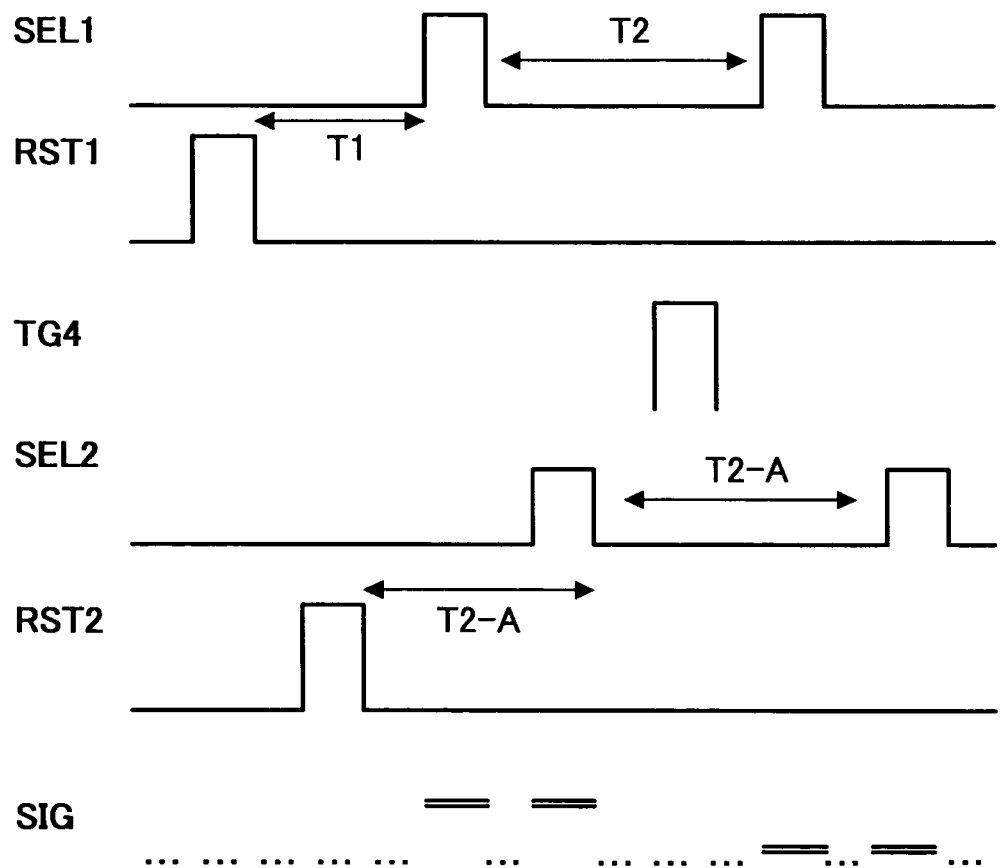
FIG. 24 is a timing chart showing the operation of the CMOS imaging device of FIG. 22.

FIG. 24 is a timing chart explaining the read operation that of the CMOS imaging device 120 of FIG. 22, wherein FIG. 24 shows the operation for the case the selected selection control line TG4 is selected.

Referring to FIG. 24, a reset pulse signal is supplied to the reset control line RST1 at first, and with this, the reset transistor RT1 caused conduction and the common floating diffusion region FD1 is initialized.

Next, a reset pulse signal is supplied to the reset control line RST2, and with this, the reset transistor RT2 causes conduction and the common floating diffusion region FD2 is initialized.

Next, a selection pulse signal is supplied to the selection control line SEL1, and with this, the select transistor SL1 that constitutes the common reading circuit of the photodiodes D12, D13, D22 and D23 causes conduction. With this, the initialization voltage of the common floating diffusion region FD1 is read out to the signal line SIG by the reading transistor RD1.

Next, a selection pulse signal is supplied to the selection control line SEL2, and with this, the select transistor SL2 that constitutes the common reading circuit of the photodiode D32, D33, D42 and D43 causes conduction. With this, the initialization voltage of the common floating diffusion region FD2 is read out to the signal line SIG by the reading transistor RD2.

Next a transfer control signal pulse is supplied to the transfer control line TG4, and with this, the electric potential of the common floating diffusion region FD1 is changed by the photoelectrons formed in the photodiode D23. At the same time, the electric potential of the common floating diffusion region FD2 is changed by the photoelectrons formed in the photodiode D33.

Thus, by supplying the selection pulse signal to the selection control line SEL1 again, the voltage change caused in the common floating diffusion region FD1 is read out to the signal line SIG by the reading transistor RD1. Further, by supplying the selection pulse signal to the selection control line SEL2 again, the voltage change caused in the common floating diffusion region FD2 is read out to the signal line SIG by the reading transistor RD2.

Figure 25:
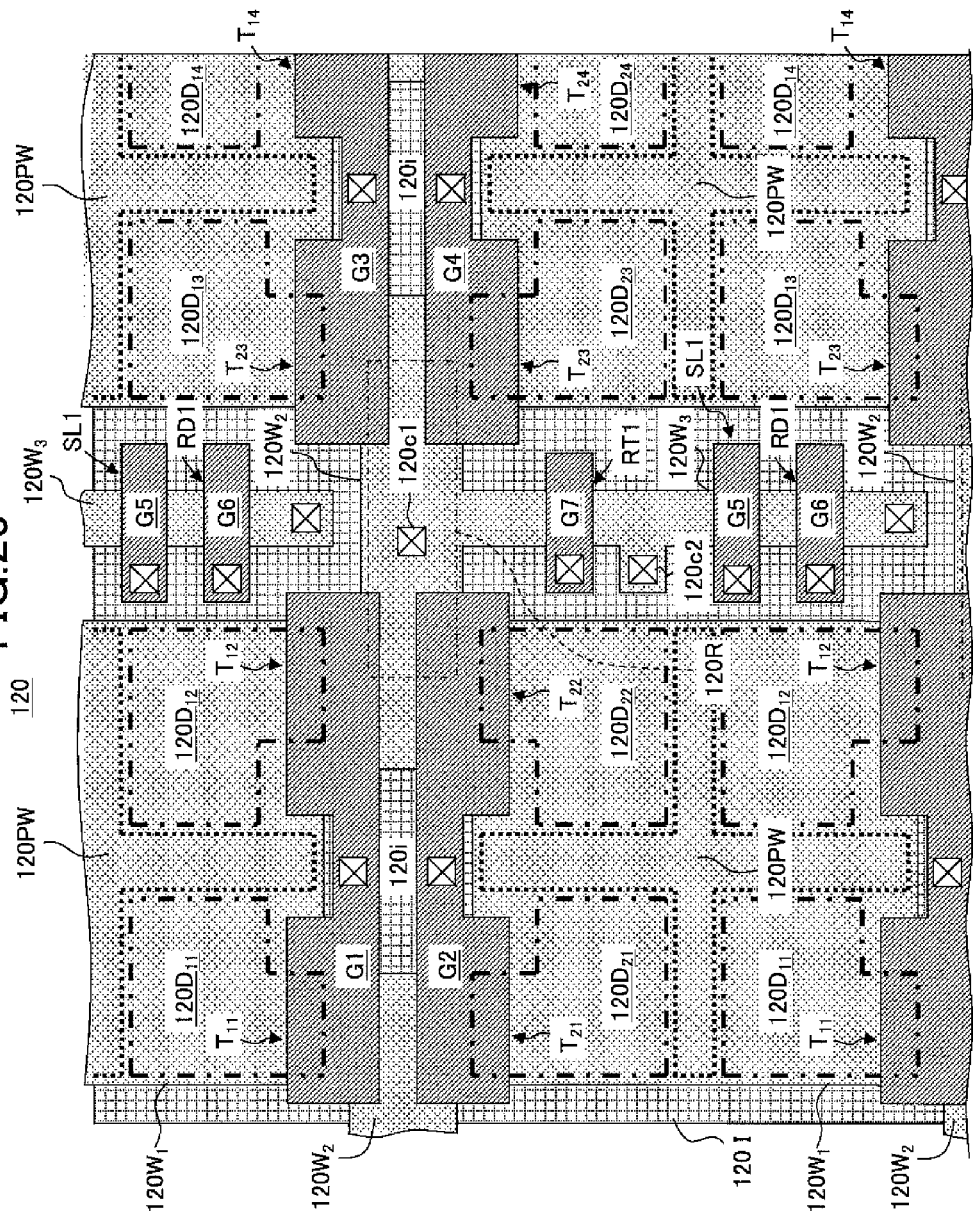
FIG. 25 is a diagram showing the layout of the CMOS imaging device according to the sixth embodiment for realizing the circuit of FIG. 22.

FIG. 25 shows the layout of the CMOS imaging device 120 that realizes the circuit of FIG. 22.

Figure 26:
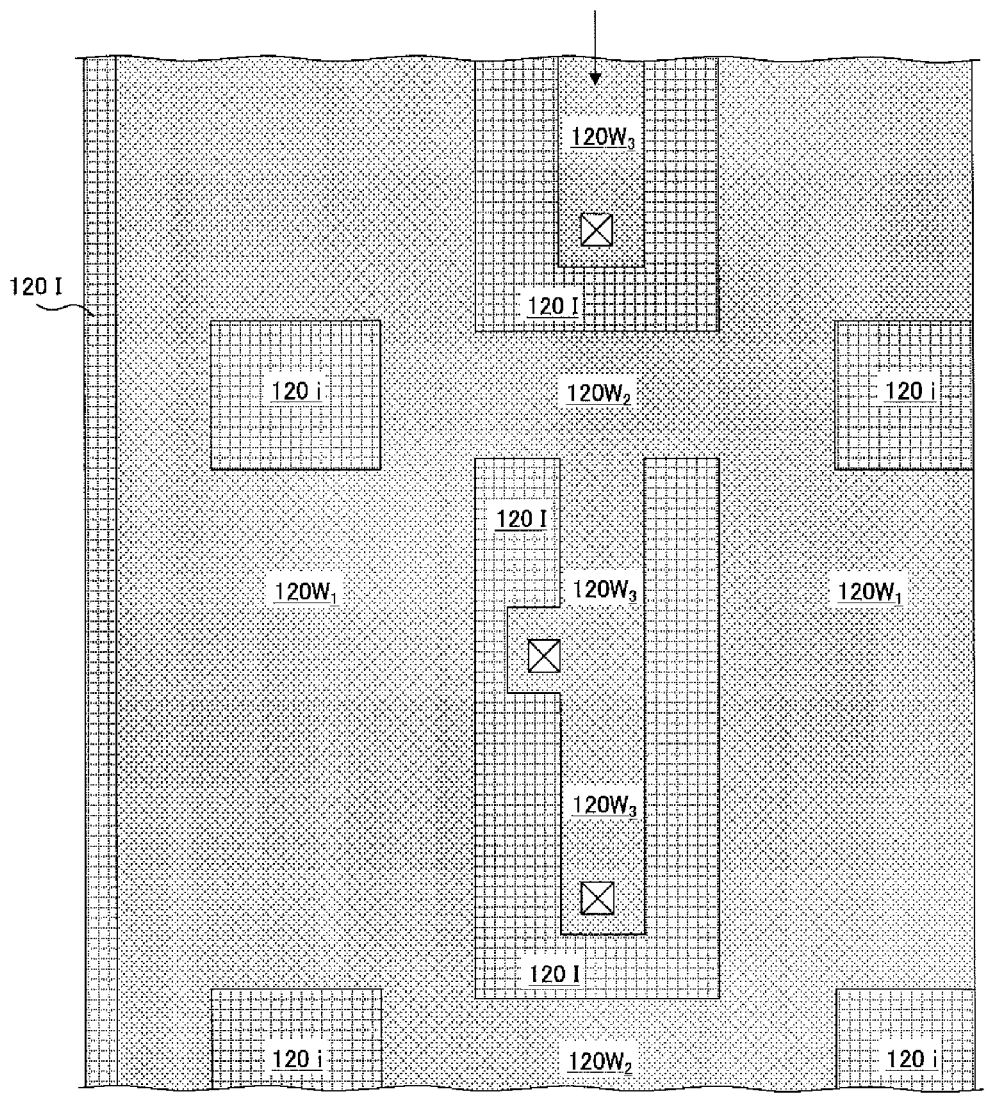
FIG. 26 is a diagram showing a device isolation region and a device region in the layout of FIG. 25.

Referring to FIG. 25, the CMOS imaging device 120 is formed in a single, continuous device region 120W defined on the silicon substrate by a device isolation region 120I shown in FIG. 26, wherein the device region 120W is formed with: plural band-like regions 120W1 extending on the substrate continuously in the column direction parallel with each other, each band-like region being formed with an island 120i of device isolation region, a device region part 120W2 connecting the plural band-like regions 120W1 with each other, and a device region part 120W3 branching out from the device region part 120W2 and extending between a pair of the device region parts 120W1 in the column direction for a limited distance. In FIG. 26, it should be noted that the device region part 120W3 at the top of the drawing extends in the upward direction of the drawing beyond the area of illustration. Further, it can be seen that another device region part 120W3 extends in the downward direction, and hence in the column direction.

Figure 27:
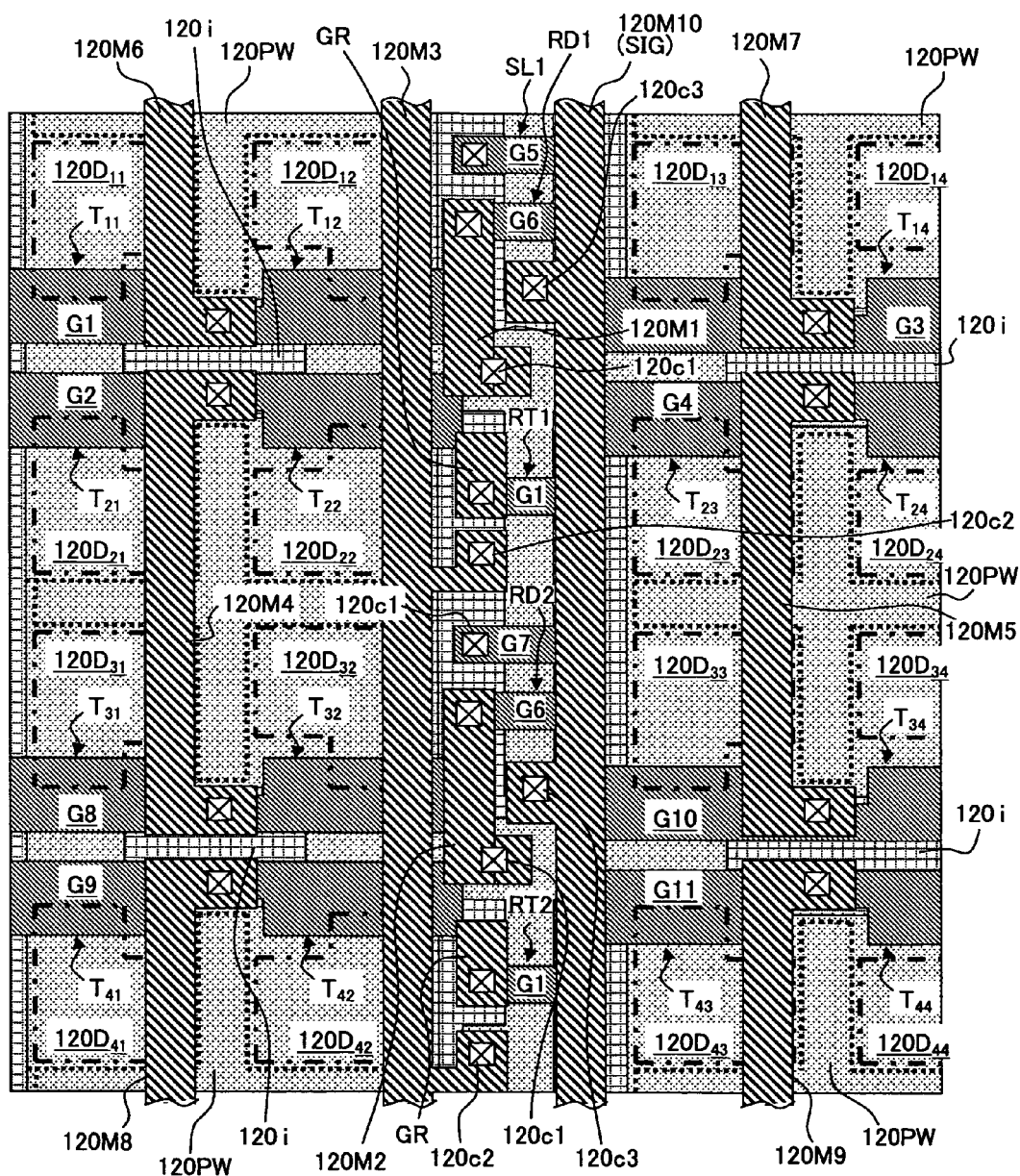
FIG. 27 is a diagram showing an interconnection pattern of a first layer used with the layout of FIG. 22.

Referring to FIG. 25 again, it can be seen that there is formed a p-type device isolation well 120PW of cross shape shown also in FIG. 27 in the device region part 120W1 in correspondence to the device isolation well 20PW of FIG. 16, wherein n-type diffusion regions 120D11-120D14 and 120D21-120D24 corresponding to the photodiodes D11-D14 and D21-D24 of FIG. 22 are formed in the device region part 120PW1 by the device isolation well 120PW in correspondence to the n-type diffusion regions 20D1-20D4 of the FIG. 11.

Further, in the device region part 120W1, it can be seen that the common floating diffusion region FD1 of FIG. 22 is formed between the photodiodes D12 and D22, and the transfer gate transistor T12 is formed between the common floating diffusion region FD1 and the photodiode D12. The common floating diffusion region FD1 extends in the device region part 120W2 in the column direction toward the adjacent device region part 120W1, while in the adjacent device region part 120W1, the transfer gate transistor T13 is formed between the common floating diffusion region FD1 and the photodiode D13 and the transfer gate transistor T23 is formed between the common floating diffusion region FD1 and the photodiode D23.

Further, in correspondence to the circuit diagram of FIG. 22, the transfer gate transistor T11 is formed adjacent to the photodiode D11 and the transfer gate transistor T21 is formed adjacent to the photodiode D21. Thereby, the transfer gate transistors T11 and T12 share a gate electrode G1. Similarly, the transfer gate transistors T21 and T22 share a gate electrode G2.

Similarly, in correspondence to the circuit diagram of FIG. 22, the transfer gate transistor T14 is formed adjacent to the photodiode D14 and the transfer gate transistor T24 is formed adjacent to the photodiode D24. Thereby, the transfer gate transistors T13 and T14 share a gate electrode G3. Similarly, the transfer gate transistors T23 and T24 share a gate electrode G4.

In the device region part 120W2, there is formed a single contact 120c1, while in the region 120R enclosed with a broken line in FIG. 25 including the contact 120c1, there is formed an LDD region corresponding to the LDD region 205 of the previous embodiment by an ion implantation process commonly to the transfer gate transistors T12, T13, T22 and T23.

Further, in the device region part 120W3, there is provided a single power supply contact 120c2 while in the device region part 120W3, there is formed a reset transistor RT1 of FIG. 22 having a gate electrode G7 between the LDD region and the power supply contact 120c2.

Further, in the device region part 120W3, there are formed a select transistor SL1 of FIG. 22 having a gate electrode G5 and a reading transistor RD1 of FIG. 22 having a gate electrode G6 at a downstream side of the power supply contact 120c2.

Further, with the construction of FIG. 25, in which the LDD region 120R is formed so as to overlap a part of the common floating diffusion region FD1 in the diffusion regions 120D11-120D24 of the respective photodiodes, the capacitance of the common floating diffusion region FD1 is reduced similarly to the embodiment of FIG. 20 explained previously, and larger voltage change is induced at the common floating diffusion region FD1 by the photoelectrons.

It should be noted that the common floating diffusion region FD1 is connected to the gate electrode G6 of the reading transistor RD1 by a metal interconnection pattern 120M1 of the first layer shown in FIG. 27 at the single contact 120c1. Similarly, the common floating diffusion region FD2 is connected to the gate electrode G6 of the reading transistor RD2 by a metal interconnection pattern 120M2 corresponding to the interconnection pattern 120M1 at the single contact 120c1.

Further, a reset voltage VR is supplied to the power supply contact 120c2 via an interconnection pattern 120M3 of the first layer shown in FIG. 27.

Further, with the construction of FIG. 27, the gate electrode G2 provided commonly to the transfer gate transistors T21 and T22 is connected to a gate electrode G8 common to the adjacent transfer gate transistors T31 and T32 neighboring in the column direction by the interconnection pattern M4 of the first layer. Similarly, a gate electrode G4 common to the transfer gate transistors T23 and T24 is connected to a gate electrode G10 provided commonly to the adjacent transfer gate transistors T33 and T34 neighboring in the column direction with an interconnection pattern M5 of the first layer.

Similar explanation holds also for other transfer gate transistor pairs. In the drawing, it should be noted that the transfer gate transistors T11 and T12 share the gate electrode G1, and the transfer gate transistors T13 and T14 share the gate electrode G3. Further, the transfer gate transistors T21 and T22 share the gate electrode G2, and the transfer gate transistors T23 and T24 share the gate electrode G4. The transfer gate transistors T31 and T32 share the gate electrode G8, and the transfer gate transistors T33 and T34 share the gate electrode G10. Further, the transfer gate transistors T41 and T42 share a gate electrode G9, and the transfer gate transistors T43 and T44 share a gate electrode G11.

Thus, the transfer gate transistors T11 and T12 are connected to an adjacent transfer gate transistor pair (not shown) neighboring in the column direction by a metal interconnection pattern 120M6 of the first layer, while the transfer gate transistors T13 and T14 are connected to an adjacent transfer gate transistor pair (not shown) neighboring in the column direction by a metal interconnection pattern 120M7 of the first layer. Similarly, the transfer gate transistors T41 and T42 are connected to an adjacent transfer gate transistor pair (not shown) neighboring in the column direction by a metal interconnection pattern 120M8 of the first layer, while the transfer gate transistors T43 and T44 are connected to an adjacent transfer gate transistor pair (not shown) neighboring in the column direction by a metal interconnection pattern 120M9 of the first layer.

Further, with the construction FIG. 27, it can be seen that a metal pattern 120M10 forming the signal line SIG extends in the column direction and is connected to the source contact 120c3 of the reading transistors RD1 and RD2.

Figure 28:
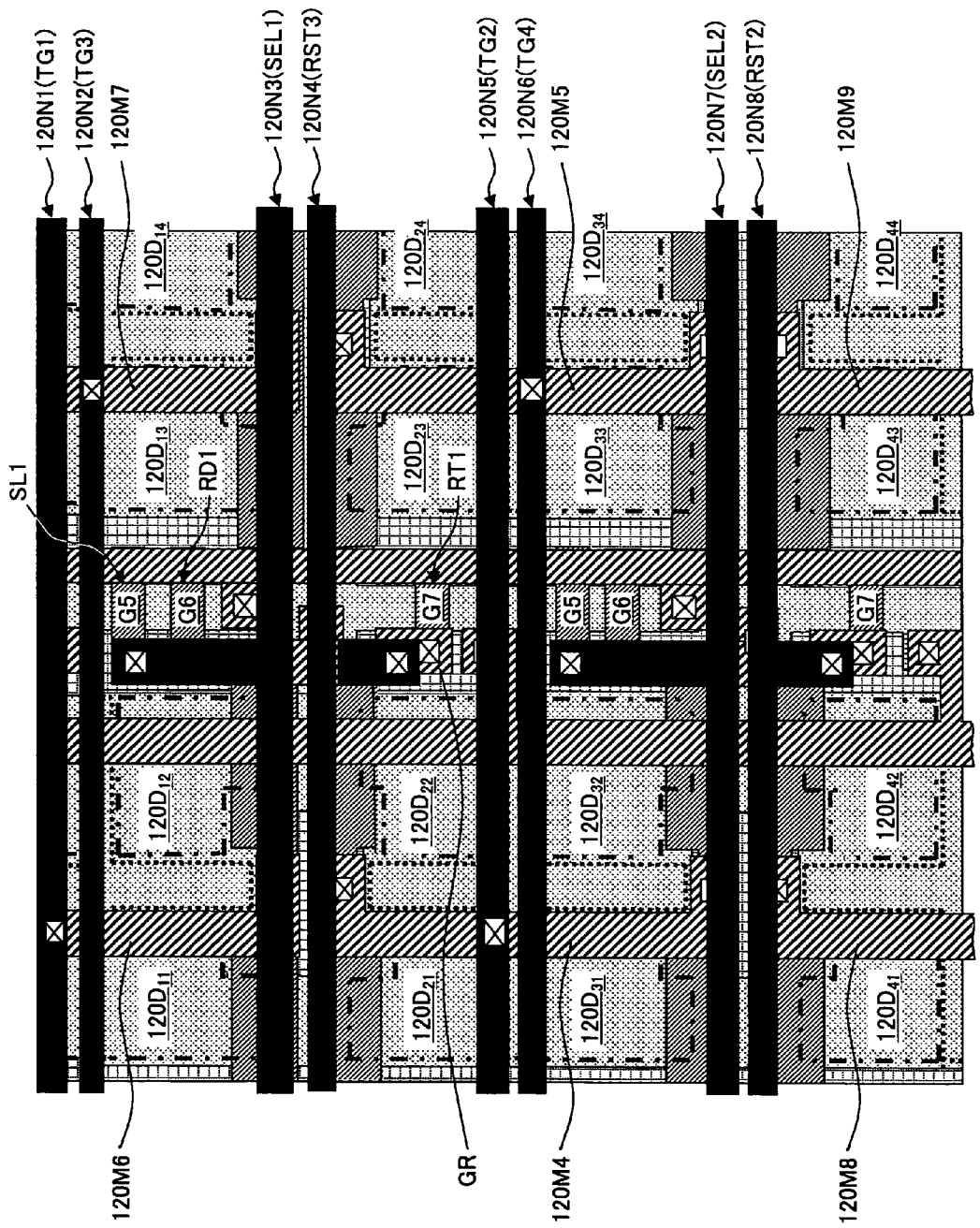
FIG. 28 is a diagram showing an interconnection pattern of a second layer used with the layout of FIG. 22.

FIG. 28 shows the second layer interconnection pattern formed in the CMOS imaging device 120.

Referring to FIG. 28, there extend metal interconnection patterns 120N1 and 120N2 on the substrate in the row direction in parallel with each other in correspondence to the selection control lines TG1 and TG3, wherein the metal interconnection pattern 120N1 is connected to a metal interconnection pattern 120M6 of the first layer while the metal pattern 120N2 is connected to a metal interconnection pattern 120M7 of the first layer at respective contacts.

Further, in FIG. 28, it can be seen that there extends a metal interconnection pattern 120N3 serving for the selection control line SEL1 in the row direction, and a metal pattern extending out from the metal interconnection pattern 120N3 is connected to the gate electrode G5 of the select transistor SL1 by making a contact via an interconnection pattern not illustrated in FIG. 27 of the first layer that leads out the gate electrode pattern G5.

Further, with the layout of FIG. 28, there extends a metal interconnection pattern 120N4 adjacent to the metal interconnection pattern 120N3 in the row direction for the reset control line RST1, wherein a metal pattern extends out from the metal interconnection pattern 120N4 and is connected to the gate electrode G7 of the reset transistor RT1 the metal lead interconnection pattern GR formed in the first layer.

Further, with the layout of FIG. 28, there extend metal interconnection patterns 120N5 and 120N6 serving for the transfer control lines TG2 and TG4 in the column direction, wherein the metal interconnection pattern 120N5 is connected to the metal interconnection pattern 120M4 of the first layer while the metal interconnection pattern 120N6 is connected to the metal interconnection pattern 120M5 of first layer eye, respectively.

Further, in the construction of FIG. 28, there extends a metal interconnection pattern 120N7 serving for the selection control line SEL2 in the row direction, and a metal pattern extending out from the metal interconnection pattern 120N7 is connected to the gate electrode G5 of the select transistor SL1 at a contact via a first layer interconnection pattern leading out the gate electrode pattern G5 not illustrated in FIG. 27.

Further, with the layout of FIG. 28, there extends a metal interconnection pattern 120N8 adjacent to the metal interconnection pattern 120N7 in the row direction for the reset control line RST2, wherein a metal pattern extends out from the metal interconnection pattern 120N8 and is connected to the gate electrode G7 of the reset transistor RT2 via a metal lead interconnection pattern GR formed in the first layer.

With this, the circuit that explained with FIG. 22 previously is formed.

With the present embodiment, it is possible to array arrange the photodiodes with close separation not only in the column direction but also in the row direction in a CMOS imaging device, and it becomes possible to improving the resolution or increase the detecting area of the individual photodiodes.

With the present embodiment, too, it is sufficient to provide only one contact in the common floating diffusion region FD1 or FD2 for the four photodiodes, and the problem of dissipation of photoelectrons to the substrate by junction leakage is reduced. Further, it is sufficient to provide only one power supply contact in the device region part 120W3 for the four photodiodes, and it becomes possible to improve production yield of the CMOS imaging significantly.

Particularly, with the layout of FIG. 28, it becomes possible to restrict the number of the interconnection patterns of the second layer per one pixel pitch to two (120N1 and 120N2, 120N3 and 120N4, 120N5 and 120N6, or 120N7 and 120N8), and the construction of the CMOS imaging device is simplified. Further, the light receiving region is not covered with the interconnection pattern, and thus, efficiency of receiving light is improved.

The present invention is applicable to general imaging devices, including digital cameras, portable telephone sets, and other electronic apparatuses.

Further, the present invention is not limited to the embodiments described heretofore, but various variations and modifications may be made without departing from the scope of the invention.

What is claimed is:

1. A CMOS imaging device comprising a plurality of photosensors arranged in a first direction and a second direction perpendicular to the first direction,
   wherein the photosensors comprising a first CMOS photosensor, a second CMOS photosensor and a fifth CMOS photosensor arranged in the first direction, a third CMOS photosensor, a fourth CMOS photosensor and a sixth CMOS photosensor arranged in the first direction,
   wherein each of said third CMOS photosensor, said fourth CMOS photosensor and said sixth CMOS photosensor are respectively arranged in the second direction relative to each of said first CMOS photosensor, said second CMOS photosensor and said fifth CMOS photosensor,
   wherein said photosensors further comprising a first gate electrode, and a second gate electrode,
   wherein the first CMOS photosensor and the second CMOS photosensor are formed in a device region defined by a first device isolation region of nearly U-shape in a semiconductor substrate, and wherein the third CMOS photosensor and the fourth CMOS photosensor are formed in a device region defined by a second device isolation region of nearly U-shape in the semiconductor substrate,
   wherein said first CMOS photosensor is located between said second CMOS photosensor and said fifth CMOS photosensor, and said third CMOS photosensor being located between said fourth CMOS photosensor and said sixth CMOS photosensor,
   wherein the first device isolation region is formed between the first CMOS photosensor and the second CMOS photosensor, and the second device isolation region is formed between the third CMOS photosensor and the fourth CMOS photosensor,
   wherein said first CMOS photosensor and said third CMOS photosensor are connected by a first device region part located between said first CMOS photosensor and said third CMOS photosensor,
   wherein said second CMOS photosensor and said fourth CMOS photosensor are connected by a second device region part located between said second CMOS photosensor and said fourth CMOS photosensor, wherein said fifth CMOS photosensor and said sixth CMOS photosensor are connected by a fifth device region part located between said fifth CMOS photosensor and said sixth CMOS photosensor, wherein said first device region part and said second device region part are connected by a third device region part extending in said first direction and functioning as a floating diffusion region, wherein said first device region part, said second device region part and said third device region part are electrically connected, wherein said second device isolation region of nearly U-shape defines a fourth device region part branching out from said third device region part and extending in said second direction, wherein said first gate electrode is located on said first device region part and said fifth device region part, and extends from said first device region part to said fifth device region part in said first direction, wherein said second gate electrode is located on said first device region part and said fifth device region part, and extends from said first device region part to said fifth device region part in said first direction, and wherein said first gate electrode is located closer to said first CMOS photosensor and fifth CMOS photosensor than said second gate electrode.

2. The CMOS imaging device as claimed in claim 1, wherein said third device region part is located between said first device region part and said second device region part in said first direction.

3. The CMOS imaging device as claimed in claim 1, further comprising:
a first island of said device isolation region located between said first device region part and said fifth device region part.

4. The CMOS imaging device as claimed in claim 3, wherein:
said first gate electrode and said second gate electrode are located on said first island of said device isolation region.

5. The CMOS imaging device as claimed in claim 1, wherein:
said photosensors comprise a seventh CMOS photosensor arranged with said first CMOS photosensor, second CMOS photosensor and said fifth CMOS photosensor in said first direction, an eighth CMOS photosensor arranged in said second direction relative to said seventh CMOS photosensor, a third gate electrode and a fourth gate electrode, said second CMOS photosensor is located between said first CMOS photosensor and said seventh CMOS photosensor in said first direction, said fourth CMOS photosensor is located between said third CMOS photosensor and said eighth CMOS photosensor in said first direction, said seventh CMOS photosensor and said eighth CMOS photosensor are connected by a sixth device region part located between said seventh CMOS photosensor and said eighth CMOS photosensor, said third gate electrode is located on said second device region part and said sixth device region part, and extends from said second device region part to said sixth device region part in said first direction, said fourth gate electrode is located on said second device region part and said sixth device region part, and extends from said second device region part to said sixth device region part in said first direction, and said third gate electrode is located closer to said second CMOS photosensor and seventh CMOS photosensor than said fourth gate electrode.

6. The CMOS imaging device as claimed in claim 5, further comprising:
a second island of said device isolation region located between said second device region part and said sixth device region part.

7. The CMOS imaging device as claimed in claim 6, wherein:
said third gate electrode and said fourth gate electrode are located on said second island of said device isolation region.

8. The CMOS imaging device as claimed in claim 5, wherein:
said first gate electrode and said third gate electrode are separated from each other; and
said second gate electrode and said fourth gate electrode are separated from each other.

9. The CMOS imaging device as claimed in claim 1, further comprising:
a first single contact formed on said first gate electrode; and
a second single contact formed on said second gate electrode.

10. The CMOS imaging device as claimed in claim 1, further comprising:
a seventh device region part located between said first CMOS photosensor and said second CMOS photosensor and separated from said third device region part in said first direction;
a third contact formed on said seventh device region part; and
a fifth gate electrode formed on said seventh device region part and located further from said third device region part than said third contact, said fifth gate electrode being electrically connected to said third device region part.

11. The CMOS imaging device as claimed in claim 1, further comprising:
a sixth gate electrode formed on said fourth device region part; and
a fourth contact formed on said fourth device region part and located further from said third device region part than said sixth gate electrode.

12. The CMOS imaging device as claimed in claim 11, wherein:
said fourth device region part includes a part branching out from said fourth region part; and
said fourth contact is located on said part branching out from said fourth region part.

* * * * *